US008456887B2

(12) United States Patent
Iwata

(10) Patent No.: US 8,456,887 B2
(45) Date of Patent: Jun. 4, 2013

(54) NONVOLATILE SEMICONDUCTOR MEMORY DEVICE

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 396 days.

(21) Appl. No.: 12/746,866

(22) PCT Filed: Sep. 9, 2008

(86) PCT No.: PCT/JP2008/066620
§ 371 (c)(1),
(2), (4) Date: Jun. 8, 2010

(87) PCT Pub. No.: WO2009/081632
PCT Pub. Date: Jul. 2, 2009

(65) Prior Publication Data
US 2011/0096590 A1  Apr. 28, 2011

(30) Foreign Application Priority Data

Dec. 26, 2007  (JP) .................................. 2007-333485

(51) Int. Cl.
*G11C 7/12* (2006.01)
(52) U.S. Cl.
USPC ...................................... 365/148; 365/189.09
(58) Field of Classification Search
USPC ........................................... 365/148, 189.09
See application file for complete search history.

(56) References Cited

U.S. PATENT DOCUMENTS

| 5,495,442 A | 2/1996 | Cernea et al. |
| 5,642,310 A * | 6/1997 | Song ........................ 365/185.29 |
| 6,504,753 B1 | 1/2003 | Scheuerlein et al. |
| 6,625,057 B2 | 9/2003 | Iwata |
| 6,633,509 B2 | 10/2003 | Scheuerlein et al. |
| 6,842,362 B2 | 1/2005 | Fujita et al. |

(Continued)

FOREIGN PATENT DOCUMENTS

| CN | 1505052 A | 6/2004 |
| EP | 1 426 969 A2 | 6/2004 |

(Continued)

OTHER PUBLICATIONS

Vettiger et al., "The "Millipede"—Nanotechnology Entering Data Storage", Mar. 2002, IEEE Transactions on Nanotechnology, vol. 1, No. 1, pp. 39-55.*

(Continued)

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

A nonvolatile semiconductor memory device comprises a cell array having plural memory cells arranged in matrix, each memory cell including a variable resistor having a resistance reversibly variable to store data corresponding to the resistance of the variable resistor; a selection circuit operative to select a memory cell from the cell array; and a write circuit operative to execute certain voltage or current supply to the memory cell selected by the selection circuit to vary the resistance of a variable resistor in the selected memory cell to erase or write data. The write circuit terminates the voltage or current supply to the selected memory cell in accordance with resistance variation situation of the variable resistor in the selected memory cell when current flowing in the selected memory cell reaches a certain level appeared after the data erase or write.

12 Claims, 28 Drawing Sheets

U.S. PATENT DOCUMENTS

| | | |
|---|---|---|
| 7,292,466 B2 | 11/2007 | Nirschl |
| 2002/0159294 A1 | 10/2002 | Kato |
| 2004/0109353 A1 | 6/2004 | Matsuoka |
| 2004/0114444 A1* | 6/2004 | Matsuoka ............... 365/200 |
| 2006/0092737 A1 | 5/2006 | Hachino et al. |
| 2007/0133358 A1 | 6/2007 | Kubo et al. |
| 2007/0165442 A1 | 7/2007 | Hosoi et al. |

FOREIGN PATENT DOCUMENTS

| | | |
|---|---|---|
| EP | 1 426 969 A3 | 6/2004 |
| EP | 1 426 970 A2 | 6/2004 |
| EP | 1 426 970 A3 | 6/2004 |
| JP | 2002 329397 | 11/2002 |
| JP | 2004 185745 | 7/2004 |
| JP | 2004 234707 | 8/2004 |
| JP | 2006-134398 A | 5/2006 |
| KR | 10-2004-0048864 | 6/2004 |
| KR | 10-2007-0073629 | 9/2007 |
| WO | 2006 137111 | 12/2006 |
| WO | 2007 080840 | 7/2007 |
| WO | WO 2008/012871 A1 | 1/2008 |

OTHER PUBLICATIONS

Korean Office Action issued Nov. 29, 2011 in patent application No. 10-2010-7016621 with English translation.
Japanese Office Action issued Apr. 17, 2012 in Patent Application No. 2007-333485 with English Translation.
European Office Action issued Aug. 29, 2011, in Patent Application No. 08 864 075.0.
Taiwanese Office Action Issued Dec. 26, 2012 in Patent Application No. 097135206 (with English translation).
Chinese Office Action dated Nov. 2, 2012, in Chinese Patent Application No. 200880122883.6 (with English Translation).
Office Action issued Jul. 3, 2012 in Japanese Patent Application No. 2007-333485 with English language translation.
Office Action issued Jul. 20, 2012 in Korean Patent Application No. 10-2010-7016621 with English language translation.
Zhuang, W. W. et al., "Novell Colossal Magnetoresistive Thin Film Nonvolatile Resistance Random Access Memory (RRAM)", IEDM, pp. 193-196 (7.5.1-7.5.4) (2002).
Sawa, Akihito, "Nonvolatile Resistance-Switching Memory in Transition-Metal Oxides (ReRAM)", Oyo Buturi, vol. 75, No. 9, pp. 1109-1114 (2006).
Lee, Kwang-Jlin et al. "A 90nm 1.8V 512Mb Diode-Switch PRAM With 266MB/s Read Throughput", IEEE International Solid-State Circuits Conference, Digest of Technical Papers, Session 26/ Non-Volatile Memories/26.1 pp. 472, 473 and 616 (2007).
Schroegmeier, P. et al., "Time Discrete Voltage Sensing and Iterative Programming Control for a $4F^2$ Multilevel CBRAM", Symposium on VLSI Circuits Digest of Technical Papers, pp. 186-187 (2007).
Hosoi, Y. et al., " High Speed Unipolar Switching Resistance RAM (RRAM) Technology", IEDM Tech. Dig., Total pp. 4 (2006).
Extended European Search Report issued Dec. 20, 2010, in Application No. / Patent No. 08864075.0-2210 / 2232498 PCT/JP2008066620.

* cited by examiner (a) Schottky Structure (d) MIM Structure (b) PN Structure (e) SIS Structure (c) PIN Structure 23a: SET Reference Voltage Source Circuit 31c: S/A Reference Voltage Source Circuit 31d: S/A Reference Voltage Source Circuit 40: Reference Voltage Generation Circuit

NONVOLATILE SEMICONDUCTOR MEMORY DEVICE

TECHNICAL FIELD

The present invention relates to a nonvolatile semiconductor memory device including variable resistors of which data are stored as resistances.

BACKGROUND ART

In recent years, various nonvolatile semiconductor memory devices have been developed and practically used. One of them is a variable resistance memory such as a ReRAM that utilizes the resistance variation of an oxide (for example, Non-patent Document 1).

The variable resistance memory has a structure of an insulating thin film composed of an oxide, which is sandwiched between two metal electrodes. It is an element capable of exhibiting a resistance variation from the high-resistance state to the low-resistance state, or from the low-resistance state to the high-resistance state, on application of a voltage or current between the electrodes. This reversible resistance variation is used to store data. In the instant document, the variation from the high-resistance state to the low-resistance state is called "set" or "write" and the variation from the low-resistance state to the high-resistance state is called "reset" or "erase".

Such the variable resistance memory includes the unipolar type that executes current/voltage application for set and reset both in one direction and the bipolar type that executes current/voltage application for set and reset in opposite directions. The former is frequently found in those that use a transition metal oxide of the binary system composed of two elements: a transition metal and oxygen. The latter is frequently found in those that use an oxide of a ternary (2 bits per cell) or higher system composed of three or more elements including oxygen (for example, Non-patent Document 2).

The unipolar type applies a lower voltage at the time of reset than at the time of set, for a longer time than at the time of set, to transit the variable resistor to the high-resistance reset state. In this case, the reset current flows in load resistances such as the driver in the variable resistance memory, the current/voltage source circuit, the parasitic resistance on wiring, and the selected memory cell. In the set state before reset, a large current flows because of the low-resistance state, which though transits to the high-resistance state at the time of reset. Therefore, in relation to other load resistances, the voltage across the variable resistor rises instantaneously. If the voltage across the variable resistor exceeds the set voltage at that time, the variable resistor transits again to the low-resistance state and may cause a problem possibly because it can not be reset.

Non-Patent Document 1

W. W. Zhuang et al., "Novel Colossal Magnetroresistive Thin Film Nonvolatile Resistance Random Access memory", Technical Digest of International Electron Device Meeting, 2002, p. 193

Non-Patent Document 2

SAWA Akihito, "Nonvolatile resistance-switching memory in transition-metal oxides (ReRAM)", OYO BUTURI, Vol. 75, No. 09, p. 1109 (2006)

Non-Patent Document 3

Kwang-Jin Lee et al., "A 90 nm 1.8V 512 Mb Diode-Switch PRAM with 266 MB/s Read Throughput", IEEE International Solid-State Circuits Conference, Digest of Technical Papers, 2007, p. 472

Non-Patent Document 4

P. Schrogmeier et al., "Time Discrete Voltage Sensing and Iterative Programming Control for a $4F^2$ Multilevel CBRAM", Symposium on VLSI Circuits, Digest of Technical Papers, 2007, p. 186

DISCLOSURE OF INVENTION

Technical Problem

The present invention has an object to provide a nonvolatile semiconductor memory device having reliability improved by preventing failures from occurring in data erase or write.

Technical Solution

In an aspect the present invention provides a nonvolatile semiconductor memory device, comprising: a cell array having plural memory cells arranged in matrix, the each memory cell including a variable resistor having a resistance reversibly variable in response to certain voltage or current supply to store data corresponding to the resistance of the variable resistor; a selection circuit operative to select a memory cell to be erased or written data from the cell array; and a write circuit operative to execute certain voltage or current supply to the memory cell selected by the selection circuit to vary the resistance of a variable resistor in the selected memory cell to erase or write data, wherein the write circuit terminates the voltage or current supply to the selected memory cell in accordance with resistance variation situation of the variable resistor in the selected memory cell when current flowing in the selected memory cell reaches a certain level after the data erase or write.

In another aspect the present invention provides a nonvolatile semiconductor memory device, comprising: a cell array having plural memory cells arranged in matrix, the each memory cell including a variable resistor having a resistance reversibly variable in response to certain voltage or current supply to store data corresponding to the resistance of the variable resistor; a selection circuit operative to select a memory cell to be erased or written data from the cell array; and a write circuit operative to execute certain voltage or current supply to the memory cell selected by the selection circuit to vary the resistance of a variable resistor in the selected memory cell to erase or write data, wherein the write circuit terminates the voltage or current supply to the selected memory cell in accordance with resistance variation situation of the variable resistor in the selected memory cell when voltage applying to the memory cell reaches a certain level after the data erase or write.

In yet another aspect the present invention provides a nonvolatile semiconductor memory device, comprising: a cell array having plural memory cells arranged in matrix, the each memory cell including a variable resistor having a resistance reversibly variable in response to certain voltage or current supply to store data corresponding to the resistance of the variable resistor; a selection circuit operative to select a memory cell to be erased or written data from the cell array; and a write circuit operative to execute plural types of certain voltage or current supply to the memory cell selected by the selection circuit based on ternary (2 bits per cell) or higher write data to vary the resistance of a variable resistor in the selected memory cell in three or more stages to erase or write data, wherein the write circuit terminates the voltage or current supply to the memory cell in accordance with resistance variation situation of the variable resistor in the selected memory cell when the voltage or current supplied to the memory cell reaches a certain level after the data erase or write.

Effect of the Invention

The present invention makes it possible to prevent failures from occurring in data erase or write, thereby providing a nonvolatile semiconductor memory device having improved reliability.

BEST MODE FOR CARRYING OUT THE INVENTION

The embodiments of the invention will now be described with reference to the drawings.

First Embodiment

[Entire Configuration]

Figure 1:
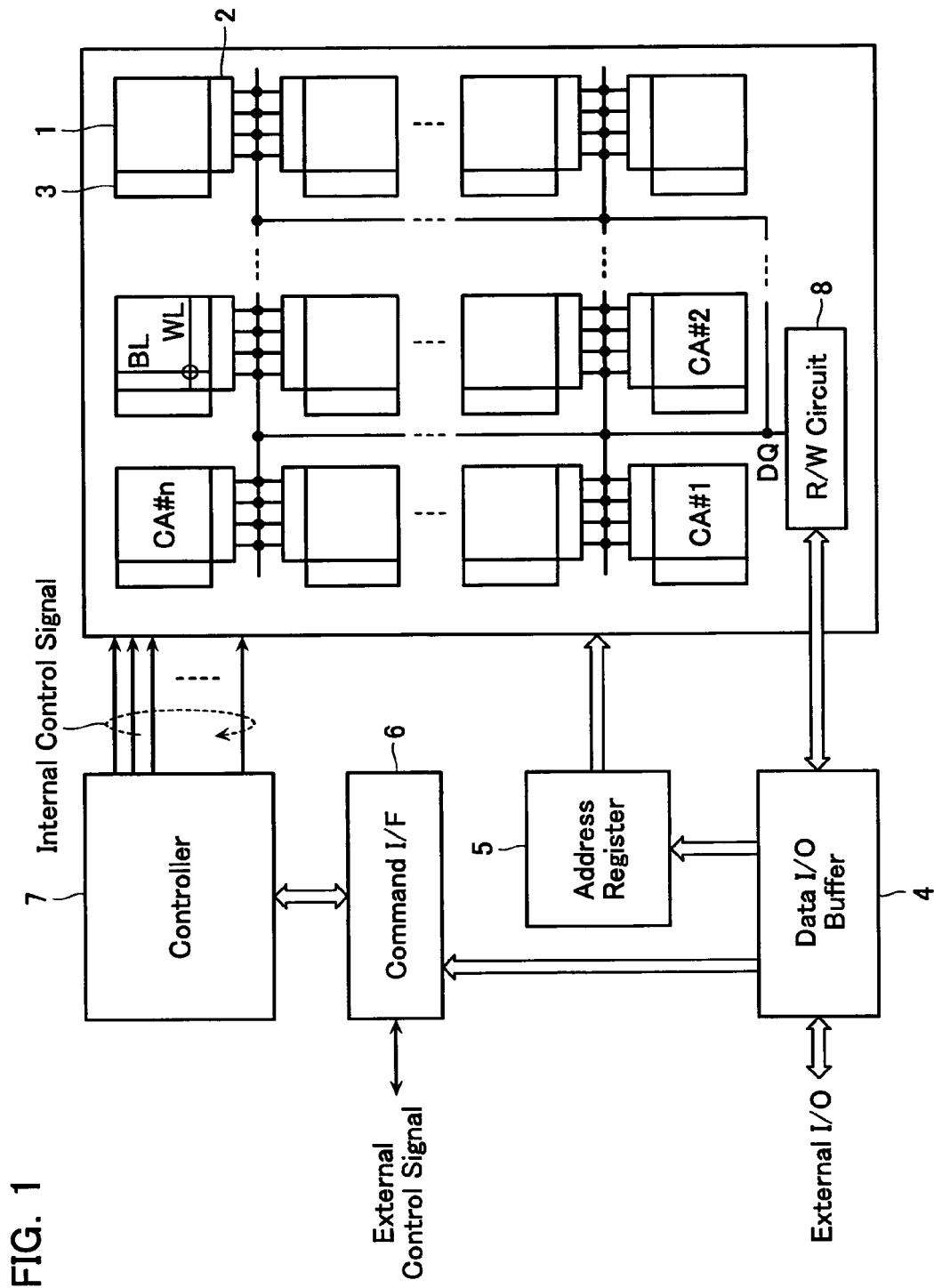
FIG. 1 is a block diagram of a nonvolatile memory according to an embodiment of the present invention.

FIG. 1 is a block diagram of a nonvolatile memory according to a first embodiment of the present invention.

The nonvolatile memory comprises a plurality of memory cell arrays 1 arranged in matrix, each including variable resistance elements such as later-described ReRAMs (variable resistors) used as memory cells. A column control circuit 2 is provided on a position adjacent to the memory cell array 1 in the bit line BL direction. It controls the bit line BL in the memory cell array 1 to erase data from the memory cell, write data in the memory cell, and read data out of the memory cell. A row control circuit 3 is provided on a position adjacent to the memory cell array 1 in the word line WL direction. It selects the word line WL in the memory cell array 1 and applies voltages required to erase data from the memory cell, write data in the memory cell, and read data out of the memory cell.

A data I/O buffer 4 is connected to an external host, not shown, via an I/O line to receive write data, receive erase instructions, provide read data, and receive address data and command data.

The data I/O buffer 4 is connected to a read/write circuit (hereinafter referred to as "R/W circuit") 8. The data I/O buffer 4 sends received write data to the column control circuit 2 via the R/W circuit 8 and receives read-out data from the column control circuit 2 via the R/W circuit 8 and provides it to external. An address fed from an external host to the data I/O buffer 4 is sent via external I/O to the column control circuit 2 and the row control circuit 3 via an address register 5. A command fed from the host via the external I/O to the data I/O buffer 4 is sent to a command interface 6. The command interface 6 receives an external control signal from the host and decides whether the data fed to the data I/O buffer 4 is write data, a command or an address. If it is a command, then the command interface transfers it as a received command signal to a controller 7. The controller 7 manages the entire nonvolatile memory to receive commands from the host, read, write, erase, and execute data I/O management. The external host can also receive status information managed by the controller 7 and decide the operation result. The status information is also utilized in control of write and erase.

The controller 7 controls the R/W circuit 8. Under this control, the R/W circuit 8 is allowed to provide a pulse of any voltage/current at any timing. The pulse formed herein can be transferred to any lines selected by the column control circuit 2 and the row control circuit 3. The R/W circuit 8 has a function of preventing failures from arising in data erase or write to the memory cell.

Peripheral circuit elements other than the memory cell array 1 can be formed in a Si substrate immediately beneath the memory array 1 formed in a wiring layer. Thus, the chip area of the nonvolatile memory can be made almost equal to the area of the memory cell array 1.

[Memory Cell Array and Peripheral Circuits]

Figure 2:
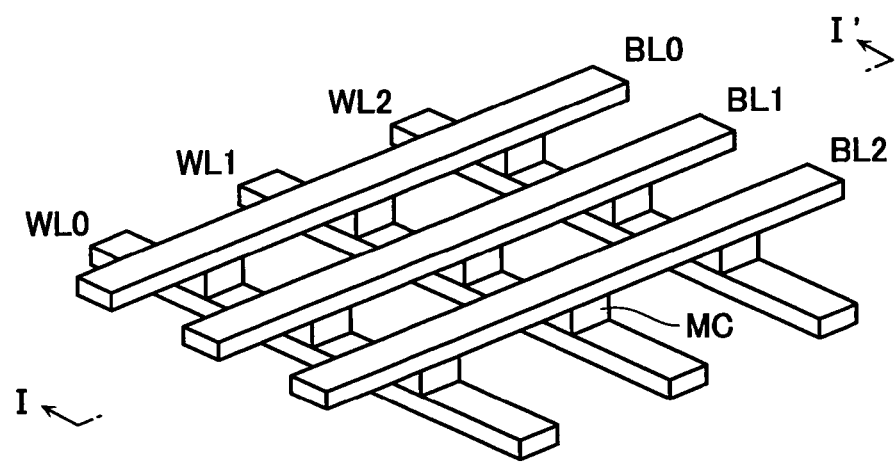
FIG. 2 is a perspective view of part of a memory cell array in the nonvolatile memory according to the same embodiment.
Figure 3:
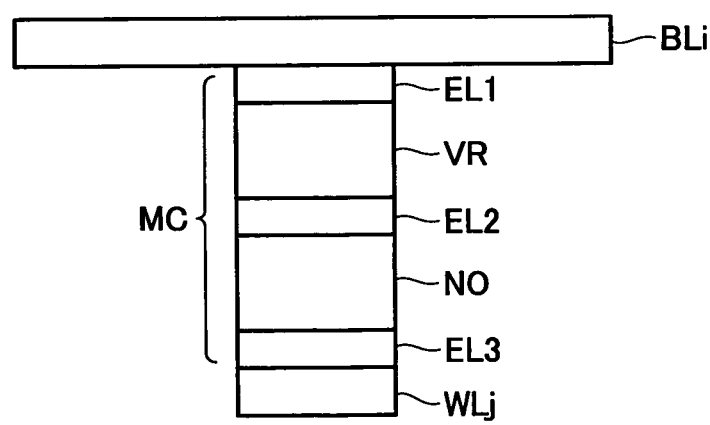
FIG. 3 is a cross-sectional view of one memory cell taken along I-I' line and seen in the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural first lines or word lines WL0-WL2 disposed in parallel, which cross plural second lines or bit lines BL0-BL2 disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serial connection circuit of a variable resistor VR and a non-ohmic element NO as shown in FIG. 3.

The variable resistor VR can vary in resistance through current, heat, or chemical energy on voltage application. Arranged on an upper and a lower surface thereof are electrodes EL1, EL2 serving as a barrier metal layer and an adhesive layer. Material of the electrodes EL1, EL2, EL3 may include Pt, Au, Ag, TiAlN, SrRuO, Ru, RuN, Ir, Co, Ti, TiN, TaN, LaNiO, Al, PtIrOx, PtRhOx, Rh/TaAlN. A metal film capable of achieving uniform orientation may also be interposed. A buffer layer, a barrier metal layer and an adhesive layer may further be interposed. Non-ohmic element NO is connected to word line WLj by electrode EL3.

The variable resistor VR may include one such as chalcogenide that varies the resistance through the phase change between the crystal state and the non-crystal state (PCRAM, for example, Non-patent Document 3); one that varies the resistance through precipitation of metal cations to form a bridge (contacting bridge) between electrodes or ionize the precipitated metal to break the bridge (CBRAM, for example, Non-patent Document 4); and one that varies the resistance through voltage or current application (ReRAM) although there is no coincident theory (The factors in resistance variation are roughly divided into two. One is associated with a resistance variation caused in response to the presence/absence of charge trapped in a charge trap present in an electrode interface. Another is associated with a resistance variation caused in response to the presence/absence of a conduction path due to a loss in oxygen. For example, Non-patent Document 2).

Figure 4:
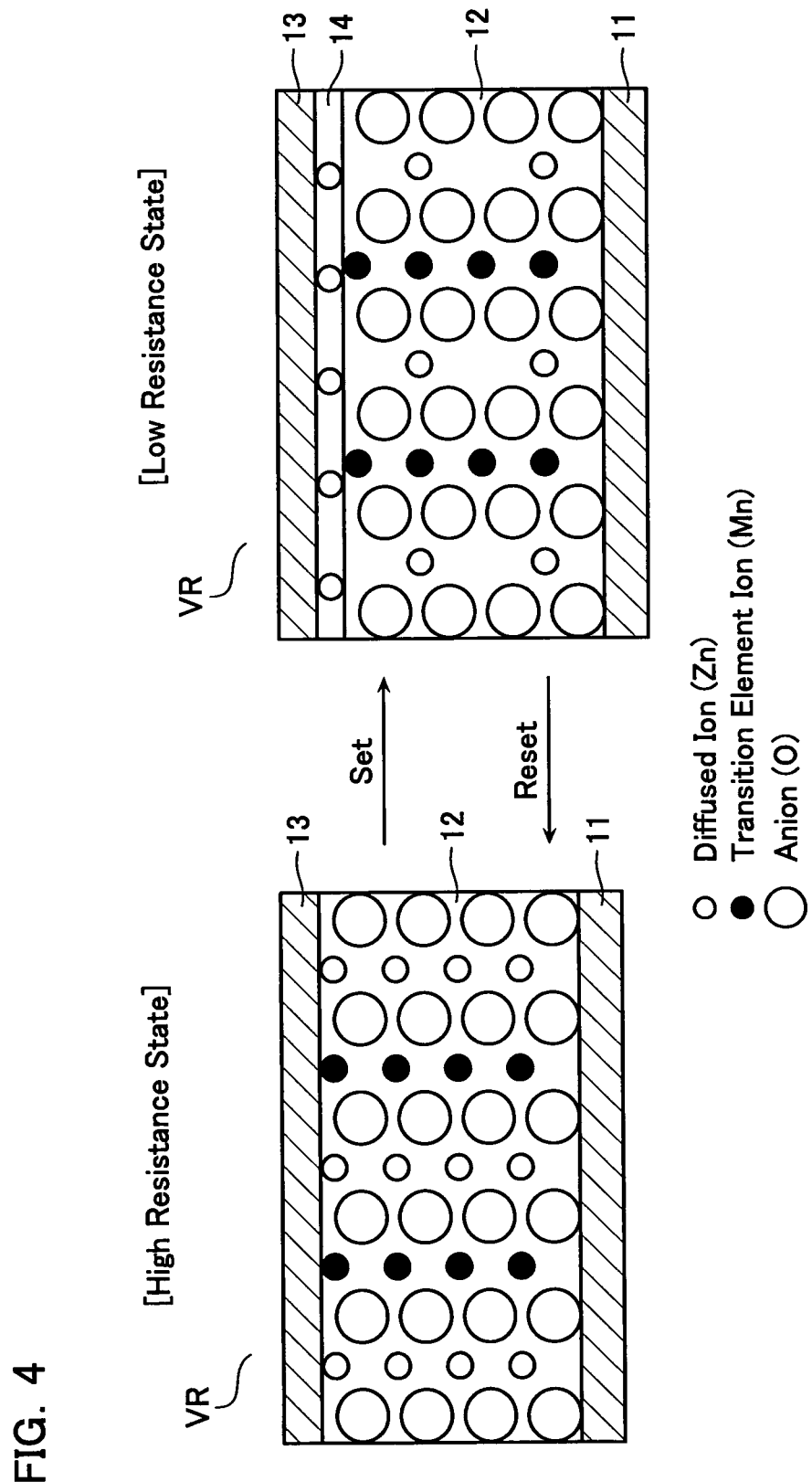
FIG. 4 is a schematic cross-sectional view showing a variable resistor example in the same embodiment.
Figure 5:
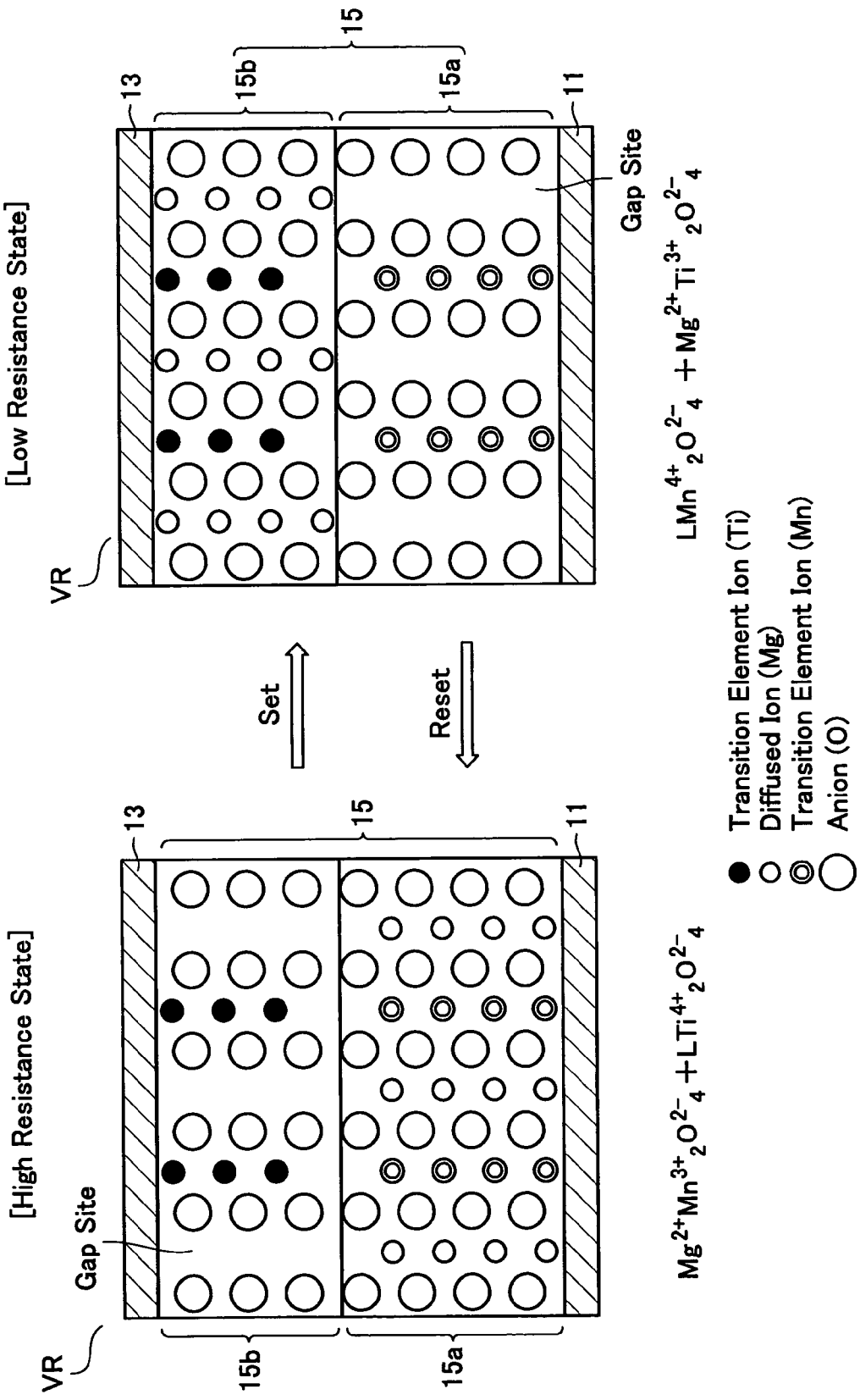
FIG. 5 is a schematic cross-sectional view showing another variable resistor example in the same embodiment.

FIGS. 4 and 5 show an example of the ReRAM. The variable resistor VR shown in FIG. 4 includes a recording layer 12 arranged between electrode layers 11, 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A comprises Zn, M comprises Mn, and X comprises O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On regeneration, a current may be allowed to flow, of which value is very small so that the material configuring the recording layer causes no resistance variation. The programmed state (low-resistance state) may be reset to the initial state (high-resistance state) by supplying a large current flow in the recording layer 12 for a sufficient time, which causes Joule heating to facilitate the oxidation reduction reaction in the recording layer 12. Application of an electric field in the opposite direction from that at the time of setting may also allow resetting.

In the example of FIG. 5, a recording layer 15 sandwiched between the electrode layers 11, 13 is formed of two layers: a first compound layer 15a and a second compound layer 15b. The first compound layer 15a is arranged on the side close to the electrode layer 11 and represented by a chemical formula $A_xM1_yX1_z$. The second compound layer 15b is arranged on the side close to the electrode layer 13 and has gap sites capable of accommodating cation elements from the first compound layer 15a.

In the example of FIG. 5, in the first compound layer 15a, A comprises Mg, M1 comprises Mn, and X1 comprises O. The second compound layer 15b contains Ti shown with black circles as transition reduction ions. In the first compound layer 15a, a small white circle represents a diffused ion (Mg), a large white circle represents an anion (O), and a double circle represents a transition element ion (Mn). The first compound layer 15a and the second compound layer 15b may be stacked in multiple layers such as two or more layers.

In such the variable resistor VR, potentials are given to the electrode layers 11, 13 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes gap sites capable of accommodating diffused ions. Accordingly, the diffused ions moved from the first compound layer 15a are trapped in the gap sites. Therefore, the valence of the transition element ion in the first compound layer 15a increases while the valence of the transition element ion in the second compound layer 15b decreases. In the initial state, the first and second compound layers 15a, 15b may be in the high-resistance state. In such the case, migration of part of diffused ions in the first compound layer 15a therefrom into the second compound layer 15b generates conduction carriers in the crystals of the first and second compounds, and thus both have electric conduction. The programmed state (low-resistance state) may be reset to the erased state (high-resistance state) by supplying a large current flow in the recording layer 15 for a sufficient time for Joule heating to facilitate the oxidation reduction reaction in the recording layer 15, like in the preceding example. Application of an electric field in the opposite direction from that at the time of setting may also allow reset.

Figure 6:
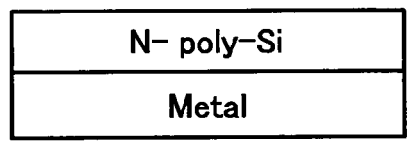
FIG. 6 is a schematic cross-sectional view showing a non-ohmic element example in the same embodiment.
Figure 6:
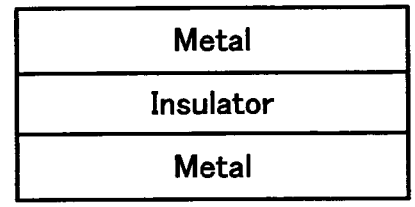
Figure 6:
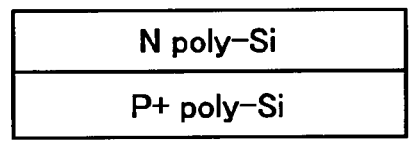
Figure 6:
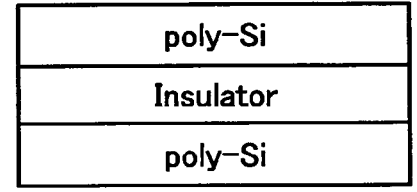
Figure 6:
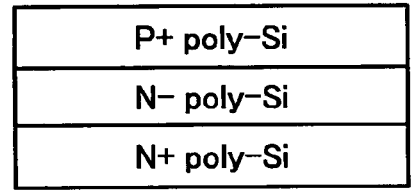

As illustrated in FIG. 6, the non-ohmic element NO may include various diodes such as (a) a Schottky diode, (b) a PN junction diode, (c) a PIN diode and may have (d) a MIM (Metal-Insulator-Metal) structure, and (e) a SIS (Silicon-Insulator-Silicon) structure. In this case, electrodes EL2, EL3 forming a barrier metal layer and an adhesive layer may be interposed. If a diode is used, from the property thereof, it can perform the unipolar operation. In the case of the MIM structure or SIS structure, it can perform the bipolar operation. The non-ohmic element NO and the variable resistor VR may be arranged in the opposite up/down relation from FIG. 3. Alternatively, the non-ohmic element NO may have the up/down-inverted polarity.

Figure 7:
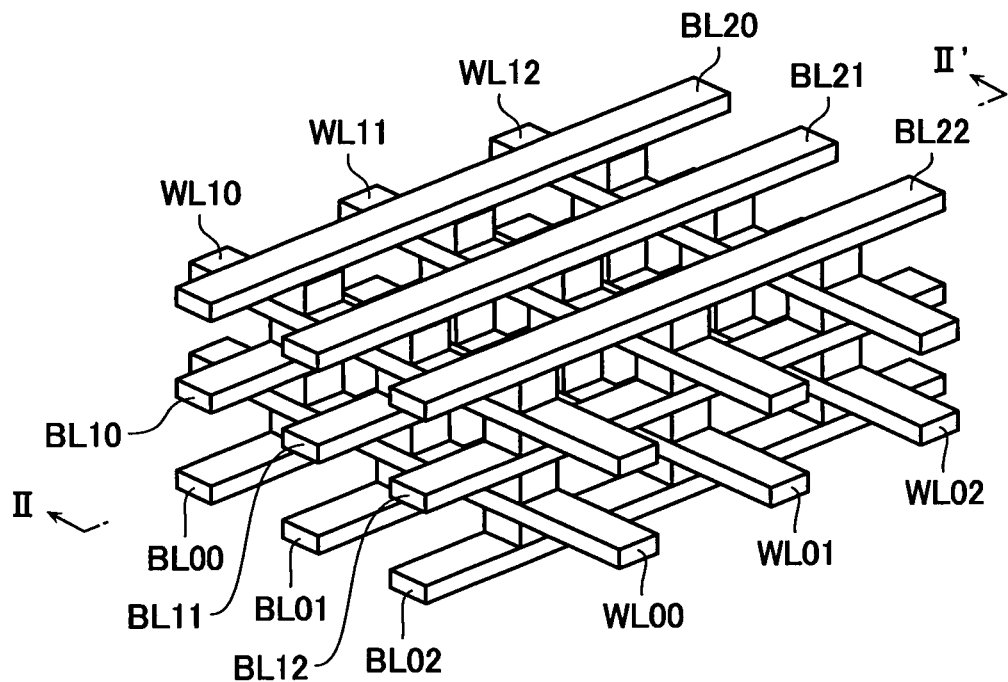
FIG. 7 is a perspective view of part of a memory cell array according to another embodiment of the present invention.
Figure 8:
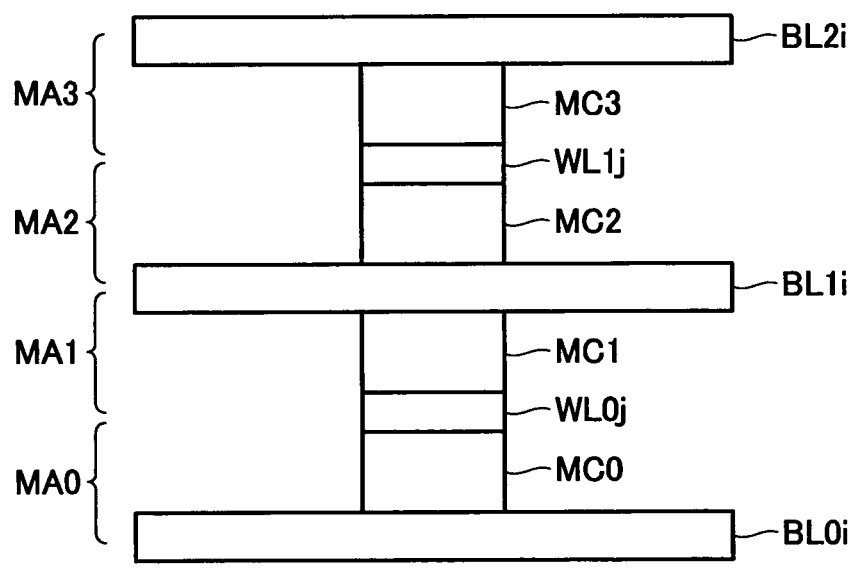
FIG. 8 is a cross-sectional view of one memory cell taken along II-II' line and seen in the direction of the arrow in FIG. 7.

A plurality of such memory structures described above may be stacked to form a three-dimensional structure as shown in FIG. 7. FIG. 8 is a cross-sectional view showing an II-II' section in FIG. 7. The shown example relates to a memory cell array of a 4-layer structure having cell array layers MA0-MA3. A word line WL0j is shared by an upper and a lower memory cell MC0, MC1. A bit line BL1i is shared by an upper and a lower memory cell MC1, MC2. A word line WL1j is shared by an upper and a lower memory cell MC2, MC3. In place of the line/cell/line repetition, an interlayer insulator may be interposed as a line/cell/line/interlayer-insulator/line/cell/line between cell array layers.

Figure 9:
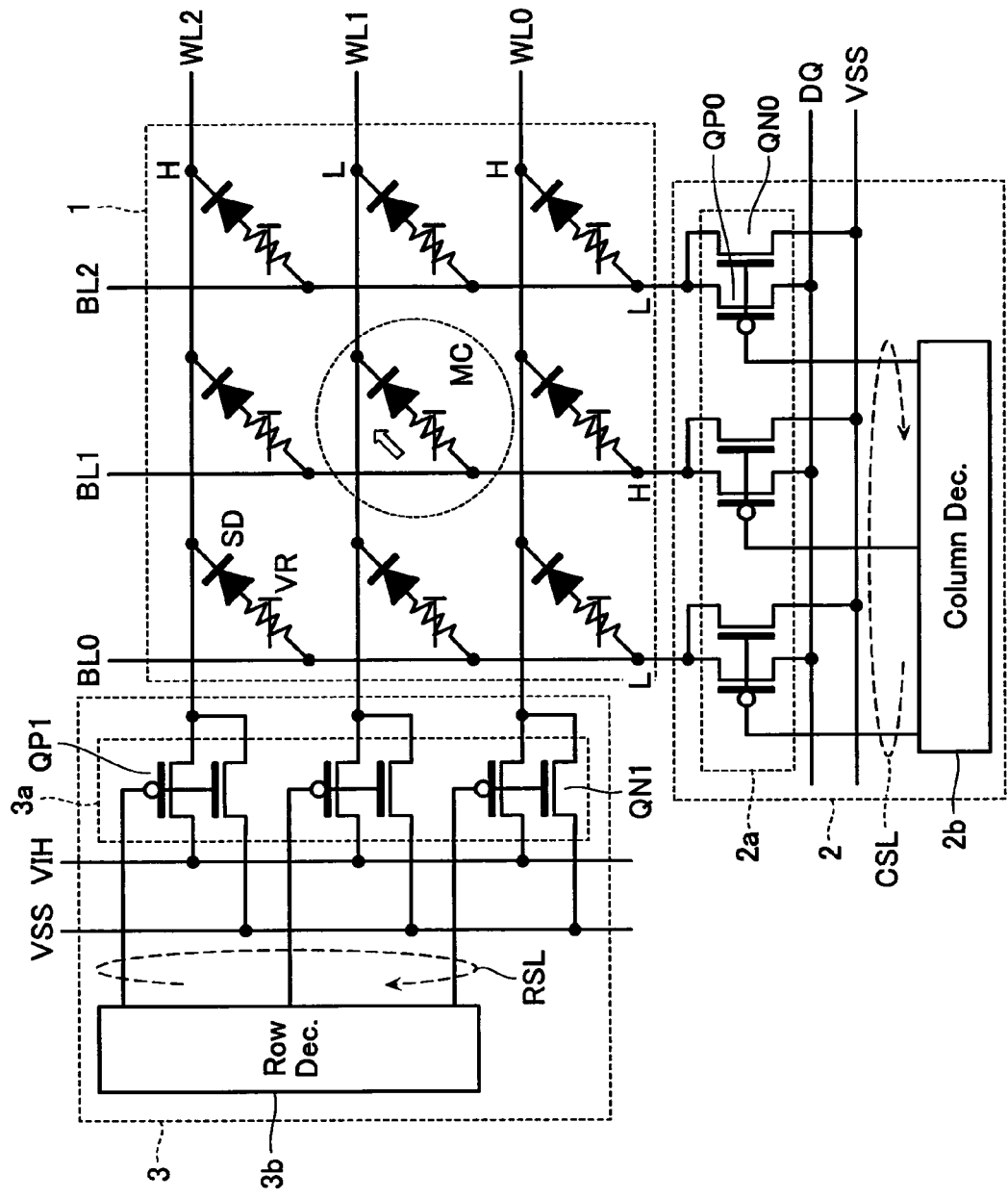
FIG. 9 is a circuit diagram of the memory cell array and peripheral circuits in the nonvolatile memory according to the same embodiment.

FIG. 9 is circuit diagram of the memory cell array 1 using a diode SD as the non-ohmic element NO and peripheral circuits. For simplicity, the description advances on the assumption that the memory has a single-layered structure.

In FIG. 9, the diode SD contained in the memory cell MC has an anode connected to the bit line BL via the variable resistor VR and a cathode connected to the word line WL. Each bit line BL has one end connected to a selection circuit 2a, which is part of the column control circuit 2. Each word line WL has one end connected to a selection circuit 3a, which is part of the row control circuit 3.

The selection circuit 2a includes a selection PMOS transistor QP0 and a selection NMOS transistor QN0, provided at each bit line BL, of which gates and drains are commonly connected. The selection NMOS transistor QN0 has a source connected to a low potential source Vss. The selection PMOS transistor QP0 has a source connected to a drive sense line DQ, which is used to apply a write pulse and supply a detection current at the time of data read. The transistors QP0 and QN0 have respective drains connected to the bit line BL, and a common gate connected to a column selection signal line CSL led from the column decoder 2b for selecting each bit line BL.

The selection circuit 3a includes a selection PMOS transistor QP1 and a selection NMOS transistor QN1, provided at each word line WL, of which gates and drains are commonly connected. The selection NMOS transistor QN1 has a source connected to the low potential source Vss. The selection PMOS transistor QP1 has a source connected to a high potential source VIH. The transistors QP1, QN1 have a common drain connected to the word line WL and a common gate connected to a row selection signal line RSL led from the row decoder 3b for selecting each word line WL.

[Selection Operation of Selection Circuit]

The following description is given to selection operation by the selection circuits 2a, 3a.

Figure 10:
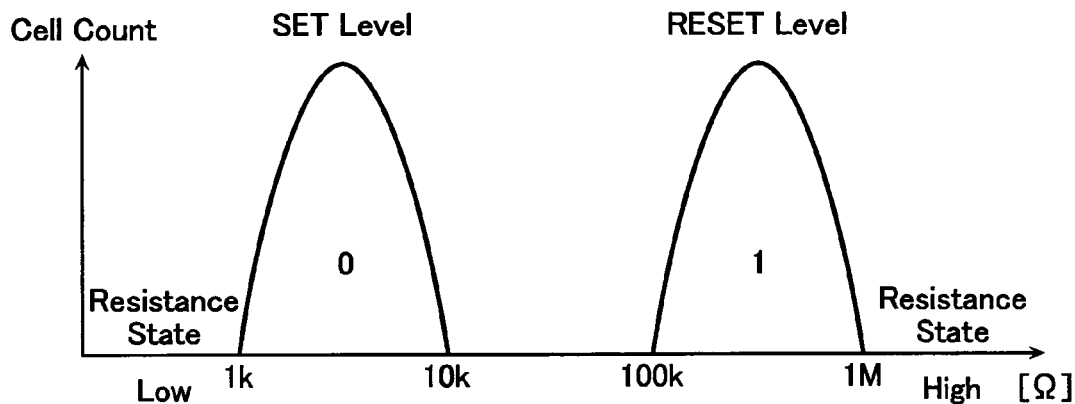
FIG. 10 is a graph showing a relation between resistance distributions and data in the memory cell in the case of binary data.

In the above-described circuits, data is stored in each memory cell MC as the resistance of the variable resistor VR. Taking the circuit shown in FIG. 9 as an example, the row selection signal line RSL is at "L" level and the column selection signal line CSL is at "H" level, for example, in the non-selected state. In this case, all word lines WL are set at "H" level and all bit lines BL at "L" level. In the non-selected state, diodes SD in all memory cells MC are reverse-biased and turned off and thus no current flows in the variable resistor VR. Selection of a middle memory cell MC linked to the word line WL1 and the bit line BL1 is considered herein. In this case, the row decoder 3b sets the middle row selection signal line RSL at "H" level and the column decoder 2b sets the middle column selection signal line CSL at "L" level. As a result, the word line WL1 is connected to the low potential source Vss and the bit line BL1 is connected to the drive sense line DQ. Accordingly, application of "H" level to the drive sense line DQ results in the word line WL1 at "L" level and the bit line BL1 at "H" level. Thus, in the selected cell, the diode SD is forward-biased to allow current to flow in the direction of the arrow. The amount of current flowing in the selected cell can be determined from the resistance of the variable resistor VR. Accordingly, by sensing the value of the current, the data can be read out. Namely, by relating the erased high-resistance state (RESET) to "1" and the programmed low-resistance state (SET) to "0" as shown in FIG. 10, the sensed current can be detected as "1" for a small value and as "0" for a large value.

The selected word line WL1 and non-selected bit lines BL are at "L" level and accordingly no current flows in them. Non-selected word lines WL and the selected bit line BL1 are at "H" level and accordingly no current flows in them as well. Therefore, no current flows in other memory cells than the selected memory cell.

[Configuration of R/W Circuit 8]

Figure 11:
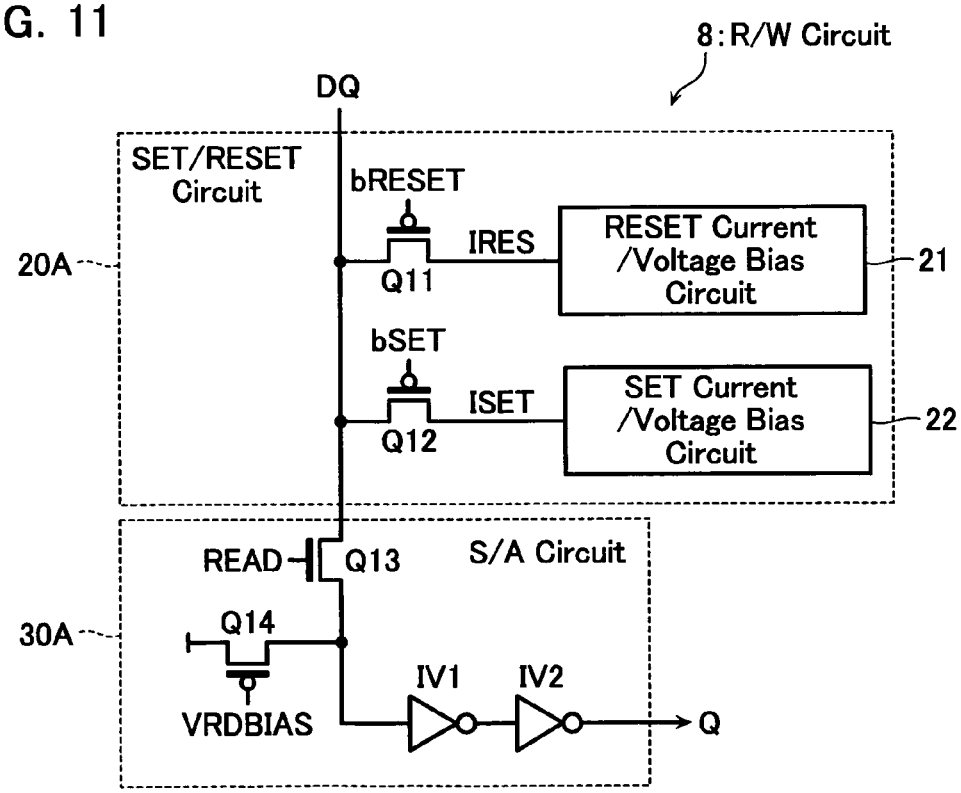
FIG. 11 shows a R/W circuit in the same embodiment.

The R/W circuit 8 of FIG. 11 is described next in detail.

FIG. 11 provides a diagram showing a configuration of the R/W circuit 8 of the present embodiment. The R/W circuit 8 shows an example applied to the nonvolatile memory of which memory cell MC stores binary data in the reset state (1) and the set state (0) as shown in FIG. 10.

The R/W circuit 8 includes a SET/RESET circuit 20A connected to the drive sense line DQ, and a sense amp circuit (hereinafter referred to as "S/A circuit") 30A.

The SET/RESET circuit 20A includes a RESET current/ voltage bias circuit 21 operative to generate a reset current IRES for the selected memory cell MC, and a SET current/ voltage bias circuit 22 operative to generate a set current ISET. It also includes transfer gates Q11, Q12 composed of PMOS transistors operative to supply the generated reset current IRES and set current ISET to the drive sense line DQ selectively in accordance with bRESET, bSET signals, respectively.

On the other hand, the S/A circuit 30A includes inverters IV1, IV2 serially connected in two stages, a transfer gate NMOS transistor Q13 arranged to connect the input terminal of the inverter IV1 with the drive sense line DQ, and a PMOS transistor Q14 arranged to precharge the input terminal of the inverter IV1 with a bias voltage VRDBIAS. The variable resistor VR in the ReRAM has a large resistance variation. Accordingly, it can be sensed/amplified sufficiently just with the inverters IV1, IV2 to receive the potential on the drive sense line DQ caused by applying a constant current bias to the memory cell. The transistors Q11-Q14 may be transistors of the opposite conduction types or NMOS and PMOS paralleled circuits.

[Operation of R/W Circuit 8]

Operation of the R/W circuit 8 thus configured is described next.

Data reset is described first.

Figure 12:
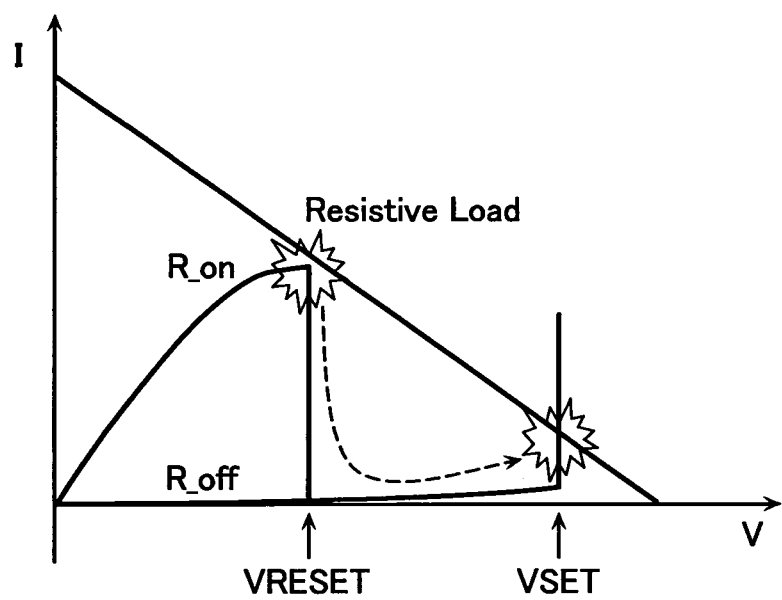
FIG. 12 is a graph showing a current-voltage relation in reset-write operation in the variable resistance memory.

FIG. 12 provides a diagram showing a drive curve at the time of resetting the variable resistor VR. Peripheral circuits and parasitic resistances on lines determine the load line in the figure. At the time of data reset, a reset voltage VRESET lower than the set voltage VSET is applied for a longer time than that at the time of set so that the current flowing in the variable resistor generates Joule heat. At the instant of reset, the variable resistor VR transits to the high-resistance state and accordingly the voltage applied to the variable resistor VR rises instantaneously. At that time, if the voltage across the variable resistor VR exceeds the set voltage VSET, the variable resistor VR is set again and transits to the low-resistance state. Thus, it can not be reset to the high-resistance state as a problem.

Figure 13A:
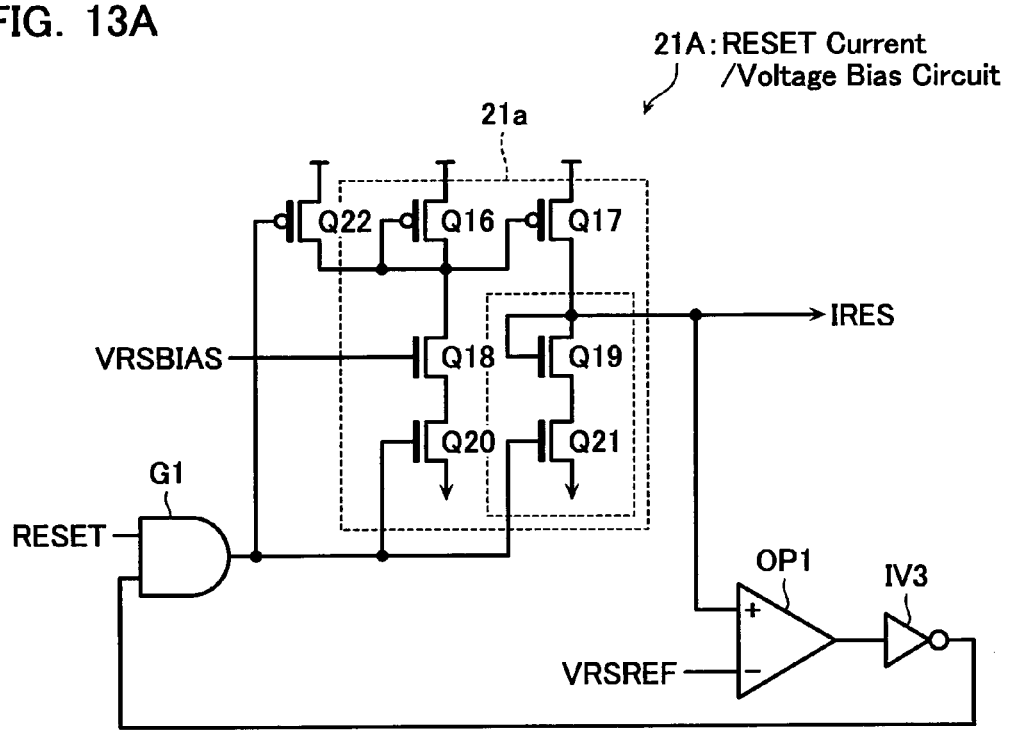
FIG. 13A shows a reset current/voltage bias circuit according to a first embodiment of the present invention.

FIG. 13A shows a RESET current/voltage bias circuit 21A according to the present embodiment, which can solve such the problem. The circuit 21A includes a current mirror circuit 21a serving as a constant current source operative to supply the reset current IRES, and a monitor circuit operative to detect a reduction in the reset current IRES to halt the supply of the reset current IRES. The monitor circuit includes an opamp OP1, an inverter IV3, a gate circuit G1 and a PMOS transistor Q22. The current mirror circuit 21a includes PMOS transistors Q16, Q17 having respective current supply gates commonly connected, and NMOS transistors Q18, Q20 and NMOS transistors Q19, Q21 connected in series to the transistors Q16, Q17, respectively.

As the drive sense line DQ is discharged to "L" level, the rise of the RESET signal turns off the transistor Q22 and turns on the transistors Q20, Q21. Accordingly, in accordance with the level of the bias voltage VRSBIAS applied to the gate of the transistor Q18, a current flows in the current mirror circuit 21a. This current flows in a first current path extending through the transfer gate Q11 and the drive sense line DQ and via the selected memory cell MC and also flows in a second current path including the transistors Q19, Q21 inside the current mirror circuit 21a. If the value of current flowing in the first current path sharply decreases after completion of resetting, the current flowing in the second current path including the transistors Q19, Q21 sharply increases. As a result, the potential on the terminal of the transistor Q19 on the drain side rises. The reference potential VRSREF may be set at a certain level such that the set voltage VSET is not applied to the variable resistor VR. In this case, at the time when the potential exceeds the reference potential VRSREF, the output from the opamp OP1 rises and the output from the inverter IV3 falls. Accordingly, the output from the gate circuit G1 becomes "L" level, which turns on the transistor Q22 and turns off the transistors Q20, Q21 to halt the supply of the reset current IRES.

Figure 13B:
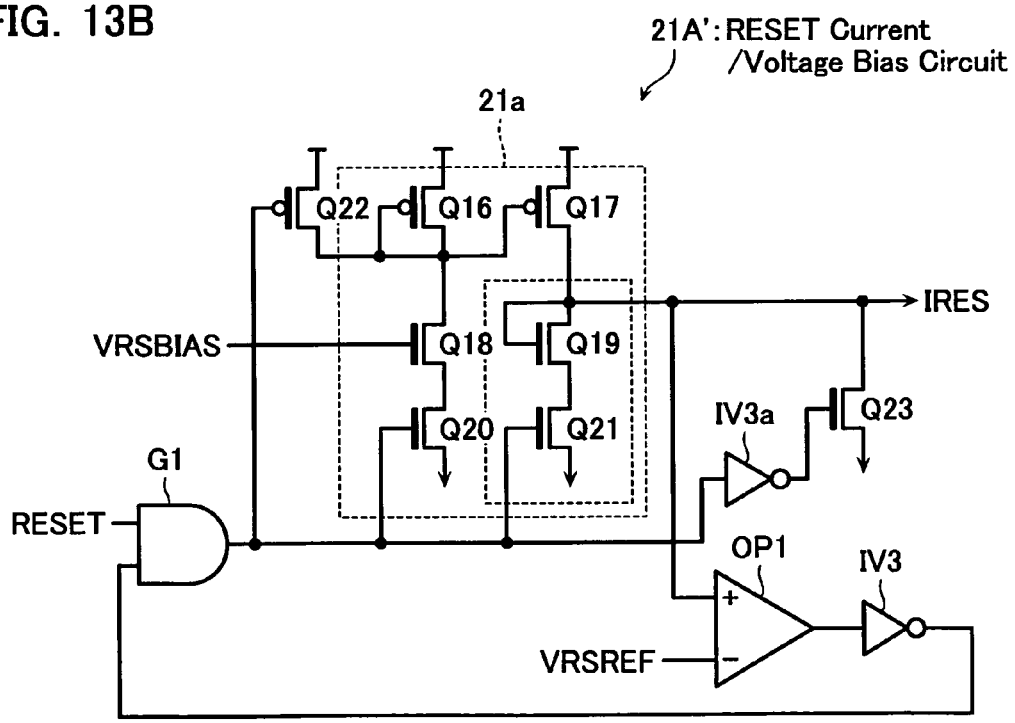
FIG. 13B shows a reset current/voltage bias circuit according to the first embodiment of the present invention.

FIG. 13B shows an example of a reset circuit including an inverter IV3a and an NMOS transistor Q23, which is added to the output terminal of the RESET current/voltage bias circuit 21A shown in FIG. 13A.

Figure 14:
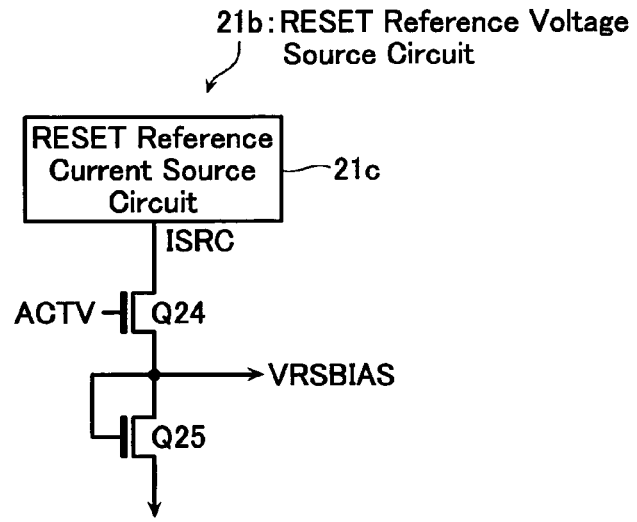
FIG. 14 shows a reset reference voltage source circuit for the reset current/voltage bias circuit according to the same embodiment.

FIG. 14 shows a RESET reference voltage source circuit 21b operative to generate the bias voltage VRSBIAS that is used to determine the value of current flowing in the current mirror circuit 21a. This circuit 21b includes a RESET reference current source circuit 21c operative to create the reference current ISRC. The reference current ISRC flows in an NMOS transistor Q25 via an NMOS transistor Q24 that is turned on with an active signal ACTV, thereby providing the reference voltage VRSBIAS at the drain of the NMOS transistor Q25.

Figure 15:
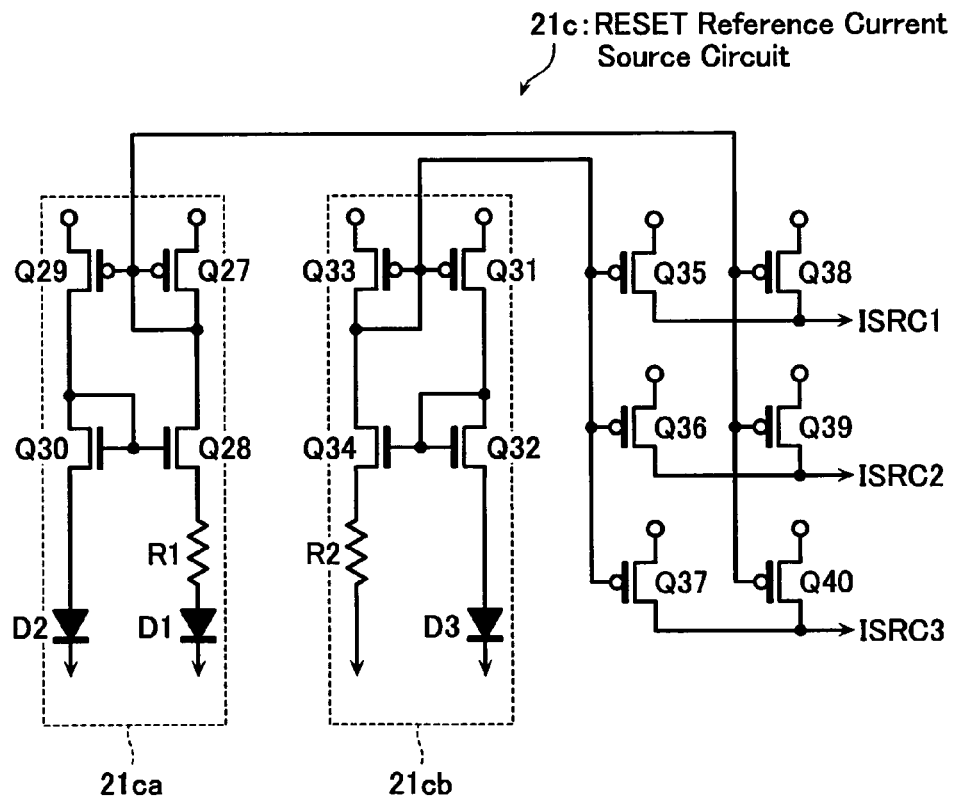
FIG. 15 shows the reset reference current source circuit shown in FIG. 14.

The reset reference current source circuit 21c operative to create the reference current ISRC may be configured as shown in FIG. 15. Namely, the reset reference current source circuit 21c includes a current mirror circuit 21ca operative to create a current component that decreases in accordance with the temperature variation, and a current mirror circuit 21cb operative to create a current component that increases in accordance with the temperature variation. As the transistors that supply the same current as that flows in the circuit 21cb, there are provided current supply PMOS transistors Q35, Q36, Q37 having respective gates commonly connected. As the transistors that supply the same current as that flows in the circuit 21ca, there are provided current supply PMOS transistors Q38, Q39, Q40 having respective gates commonly connected. The output currents from the transistors Q35 and Q38, Q36 and Q39, Q37 and Q40 are respectively summed to provide RESET reference currents ISRC1, ISRC2, ISRC3.

The current mirror circuit 21ca includes transistors Q27-Q30, a resistor R1, and diodes D1, D2. The current mirror circuit 21cb includes transistors Q31-Q34, a resistor R2, and a diode D3. The resistor R1 increases the resistance in accordance with the temperature rise. The resistor R2 varies the resistance in the opposite direction from the resistor R1 in accordance with the temperature variation. Thus, the temperature variation-compensated RESET reference current ISRC can be created.

Set operation is described next.

In setting, the value of current at the time of applying the set voltage VSET to the memory cell determines the resistance after set. Accordingly, a desirable circuit is one that exhibits less variation in the value of current relative to the applied voltage.

Figure 16A:
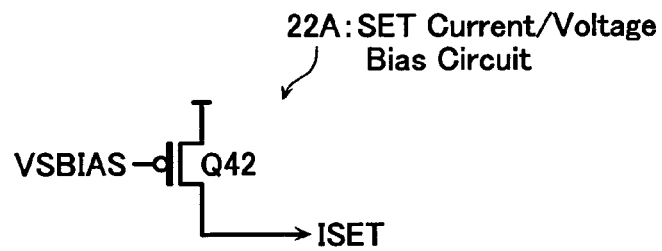
FIG. 16A shows a set current/voltage bias circuit according to the same embodiment.
Figure 16B:
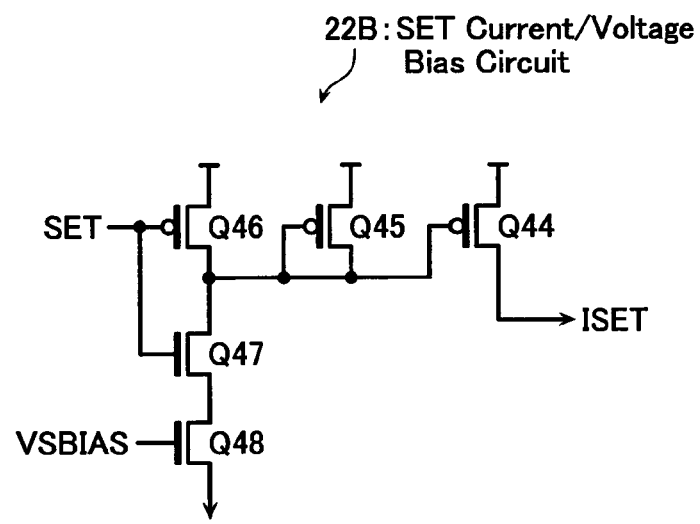
FIG. 16B shows a set current/voltage bias circuit according to the same embodiment.
Figure 17:
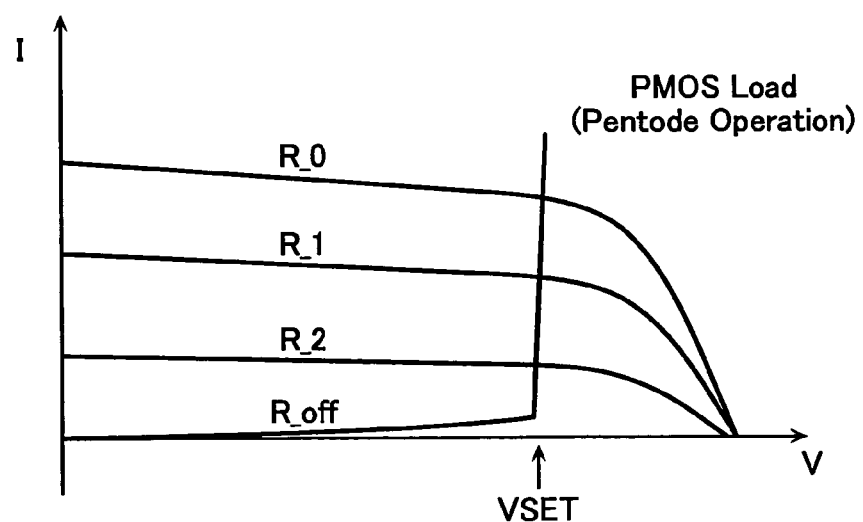
FIG. 17 is a graph showing a relation between a current-voltage characteristic of a PMOS transistor and a set voltage of the variable resistor used in the same embodiment.

FIGS. 16A-16B show examples of the SET current/voltage bias circuit 22 configured in consideration of such the point. To reduce fluctuations of the current value, a PMOS transistor is used for supplying a flow of load current in the saturated region that exhibits less fluctuation of the source current as shown in FIG. 17.

The SET current/voltage bias circuit 22A shown in FIG. 16A is the simplest example, which comprises a current supply PMOS transistor Q42. The PMOS transistor Q42 is operative in the saturated region to provide the set current ISET in accordance with the bias voltage VSBIAS applied to the gate.

The SET current/voltage bias circuit 22B shown in FIG. 16B comprises a PMOS transistor Q44 operative in the saturated region to provide the set current ISET, which is controlled by the value of current flowing in a PMOS transistor Q45. A PMOS transistor Q46 and an NMOS transistor Q47 configure an inverter circuit, which activates the circuit 22B with the set signal SET. An NMOS transistor Q48 determines the value of current flowing in the PMOS transistor Q45 in accordance with the level of the bias voltage VSBIAS applied to the gate.

Figure 18:
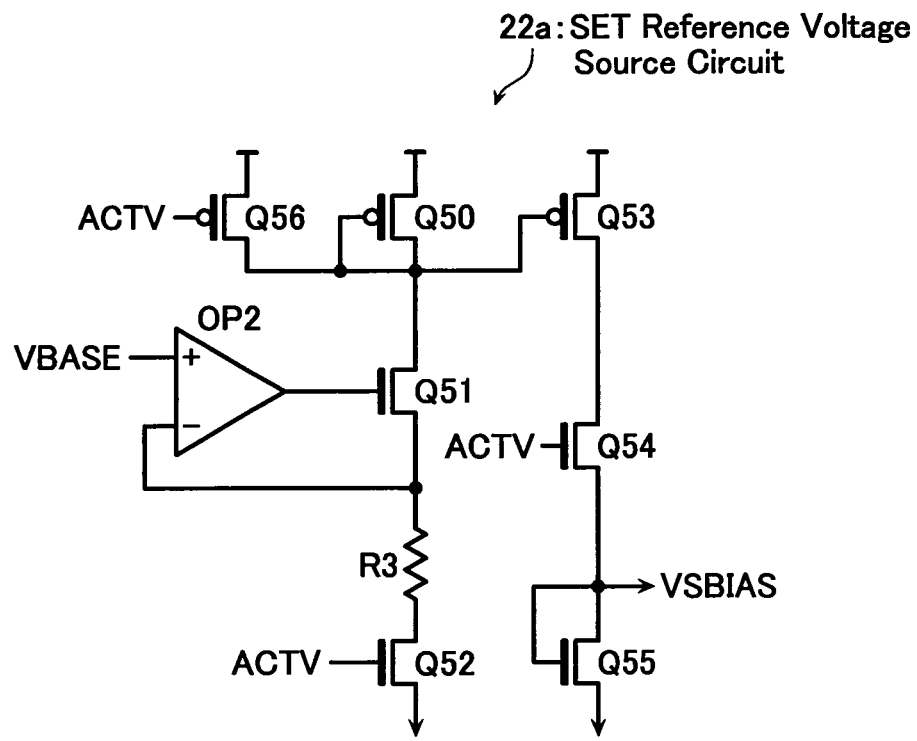
FIG. 18 shows a set reference voltage source circuit used in the circuit of FIG. 16.

In the above-described circuits, the bias voltage VSBIAS may be generated in a SET reference voltage source circuit 22a shown in FIG. 18. PMOS transistors Q50, Q53 configure a current mirror circuit. The current flowing in this current mirror circuit is controlled to have a value of VBASE/R3, which is determined by a reference voltage VBASE given to the non-inverting input terminal of an opamp OP2 and a resistor R3 connected to the inverting input terminal thereof. An NMOS transistor Q51 has a gate controlled by the output from the opamp OP2 and is operative to keep the above-described current value. An NMOS transistor Q55 generates the bias voltage VSBIAS at the drain while the above-described current flows therein. NMOS transistors Q52, Q54 and a PMOS transistor Q56 activate this circuit 22a with an active signal ACTV.

Sense operation in the S/A circuit 30A of FIG. 11 is described next.

First, the drive sense line DQ is precharged with the constant current bias and the bias voltage VRDBIAS is applied to the gate of the transistor Q14 to precharge the input terminal of the inverter IV1. Then, the read signal READ is used to turn on the transistor Q13 to sense the potential on the input terminal of the inverter IV1. The potential on the drive sense line DQ can be determined from the potential on the memory cell after precharge. Accordingly, this potential is received at the input terminal of the inverter IV1 to sense data.

Figure 19:
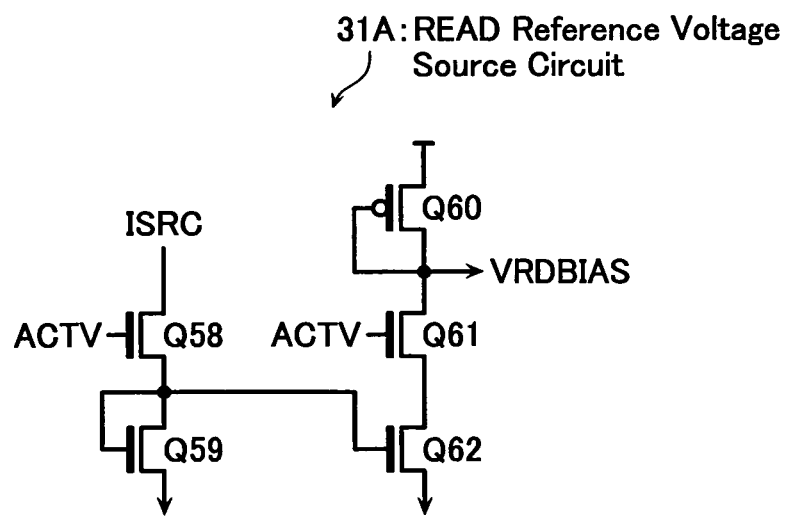
FIG. 19 shows a READ reference voltage source circuit used in a S/A circuit in the same embodiment.

FIG. 19 shows a READ reference voltage source circuit 31A for generating the bias voltage VRDBIAS applied to the gate of the transistor Q14 in the S/A circuit 30A of FIG. 11. The READ reference voltage source circuit 31A is a circuit of the current mirror type, which comprises transistors Q58-Q62. The NMOS transistors Q58, Q61 are activated with the active signal ACTV. In this case, the reference current ISRC from the reference current source circuit as exemplified in FIG. 15 flows in the NMOS transistor Q59 and similar current flows in the PMOS transistor Q60 and the NMOS transistor Q62. The PMOS transistor Q60 generates the bias voltage VRDBIAS at the drain.

Figure 20A:
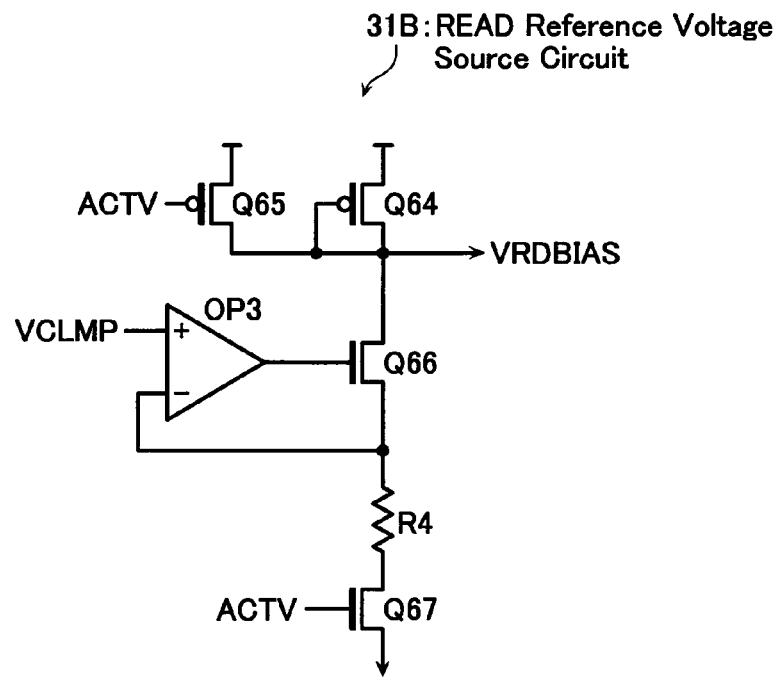
FIG. 20A shows another READ reference voltage source circuit used in the S/A circuit in the same embodiment.

FIG. 20A shows another READ reference voltage source circuit 31B operative to generate the above bias voltage VRDBIAS. The READ reference voltage source circuit 31B utilizes a constant voltage circuit, which comprises an opamp OP3 and an NMOS transistor Q66. The current flowing in a PMOS transistor Q64 is controlled to have a value of VCLMP/R4, which is determined by a reference voltage VCLMP given to the non-inverting input terminal of the opamp OP3 and a resistor R4 connected to the inverting input terminal thereof. An transistor Q64 generates the bias voltage VRDBIAS at the drain. A PMOS transistor Q65 and an NMOS transistor Q67 activate this circuit 31B with the active signal ACTV.

Figure 20B:
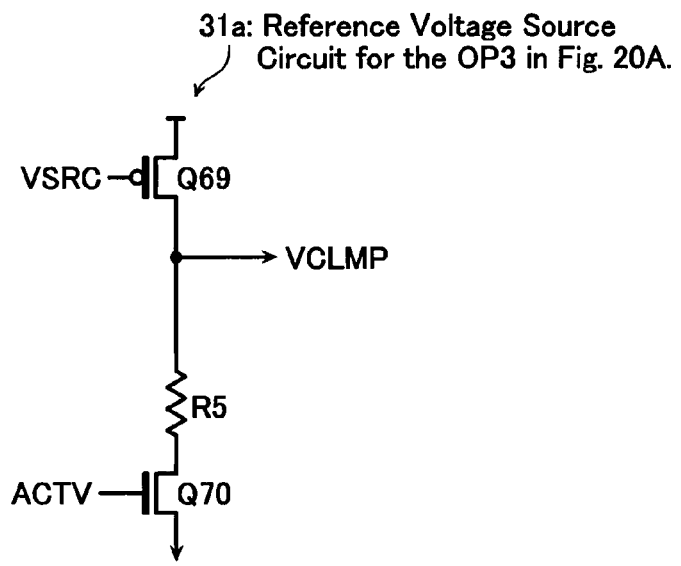
FIG. 20B shows a reference voltage source circuit for the OP3 in FIG. 20A.

FIG. 20B shows a reference voltage source circuit 31a for generating the voltage VCLMP shown in FIG. 20A. The reference voltage source circuit 31a generates the reference voltage VCLMP, which is determined by the value of current flowing in a PMOS transistor Q69 having a gate given the reference voltage VSRC and a resistor R5 connected in series thereto. An NMOS transistor Q70 is activated with the active signal ACTV.

Figure 21:
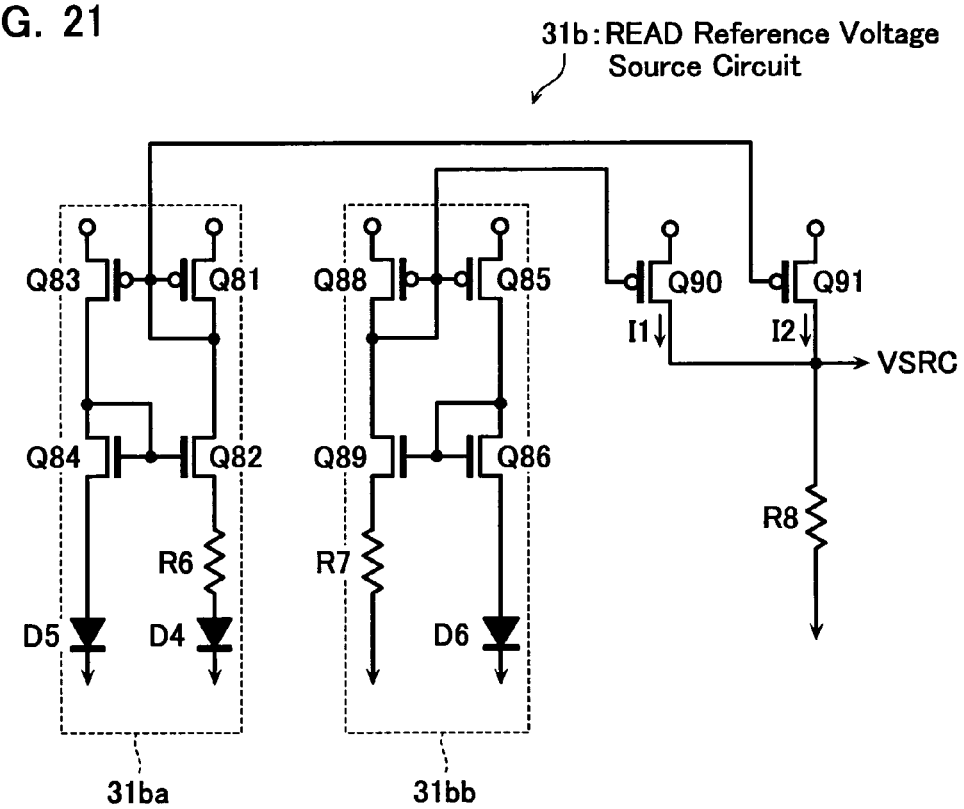
FIG. 21 shows a READ reference voltage source circuit used in the circuit of FIG. 20B.

A READ reference voltage source circuit 31b operative to generate the reference voltage VSRC may be configured as shown in FIG. 21. The READ reference voltage source circuit 31b includes a current mirror circuit 31ba operative to create a current component that decreases in accordance with the temperature variation, and a current mirror circuit 31bb operative to create a current component that increases in accordance with the temperature variation. In accordance with the values of current flowing in the current mirror circuits 31bb, 31ba, currents I1, I2 flow in PMOS transistors Q90, Q91 having respective drains commonly connected. These transistors Q90, Q91 are serially connected to a resistor R8. The reference voltage VSRC is generated at one end of the resistor R8. The current mirror circuit 31ba includes PMOS transistors Q81, Q83, NMOS transistors Q82, Q84, a resistor R6, and diodes D4, D5. The current mirror circuit 31bb includes PMOS transistors Q85, Q88, NMOS transistors Q86, Q89, a resistor R7, and a diode D6.

Second Embodiment

A R/W circuit according to a second embodiment of the present invention is described next in detail. The R/W circuit according to the second embodiment is configured such that a memory cell MC stores multivalue data, different from the first embodiment. The same elements are denoted with the same reference numerals.

Figure 22:
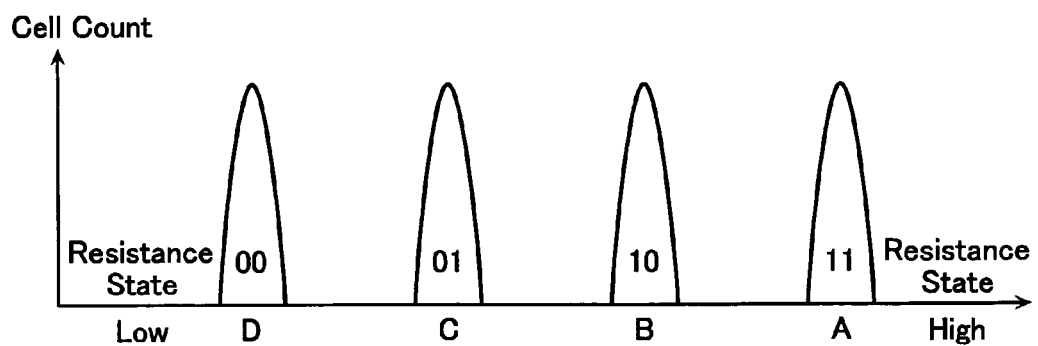
FIG. 22 shows resistance states and cell distributions in storing multivalue data.

FIG. 22 is a graph showing a relation between resistance distributions and data in memory cells in the case of quaternary (3 bits per cell) storage. This figure shows an example when 2-bit data is stored in each memory cell MC. Write is executed to each memory cell MC such that the data is contained in 4 resistance distributions A-D. Pieces of 2-bit data "11", "10", "01", "00" correspond to the distributions sequentially from the distribution A.

Figure 23:
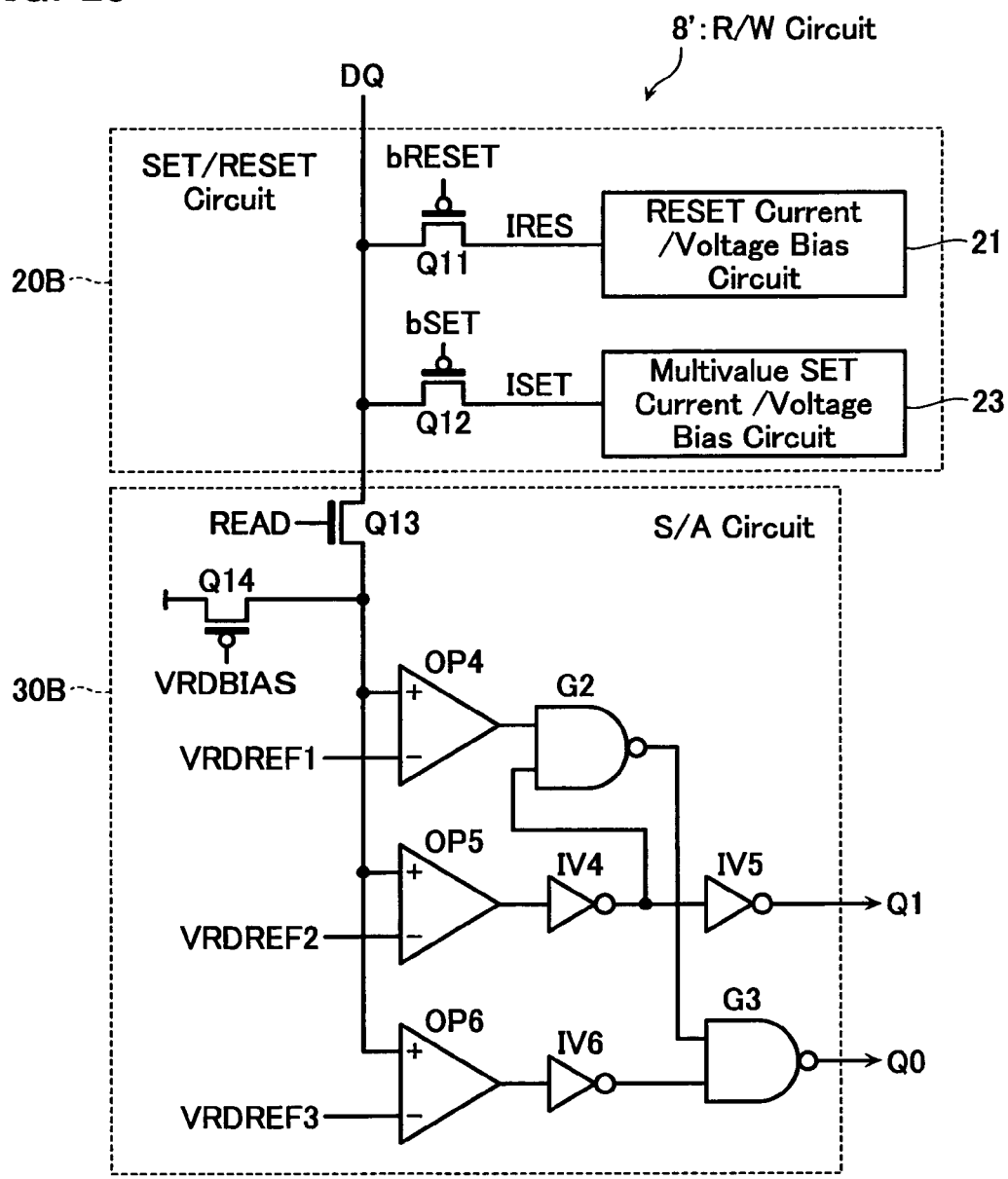
FIG. 23 is a circuit diagram showing a multivalue R/W circuit according to a second embodiment of the present invention.

FIG. 23 shows a configuration of such the quaternary R/W circuit 8'. The R/W circuit 8' includes a SET/RESET circuit 20B connected to the drive sense line DQ, and a S/A circuit 30B. Of the SET/RESET circuit 20B, a SET current/voltage bias circuit 23 operative to generate the set current ISET is prepared for multivalue use, different from the preceding embodiment.

Figure 24A:
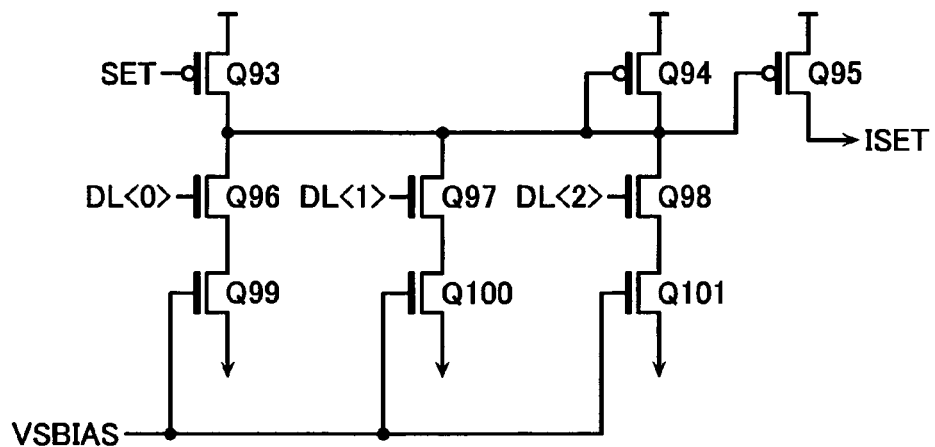
FIG. 24A shows a multivalue set current/voltage bias circuit example according to the same embodiment.

FIG. 24A shows an example of the multivalue SET current/voltage bias circuit 23A shown in FIG. 23. The multivalue SET current/voltage bias circuit 23A includes the circuit shown in FIG. 16B, which is now upgraded for quaternary use. It is configured to vary the set current ISET output from a PMOS transistor Q95 operative in the saturated region in three stages in accordance with the value of current flowing in a PMOS transistor Q94. Either one or two or three of NMOS transistors Q96-Q98 turn on at the same time in response to data signals DL<0>, DL<1>, DL<2> corresponding to the resistance states of the memory cell MC. Thus, the value of current flowing in the transistor Q94 can be varied in three stages. NMOS transistors Q99-Q101 are given the bias voltage VSBIAS that determines the current value. A PMOS transistor Q93 activates the circuit 23A with the set signal SET.

Figure 24B:
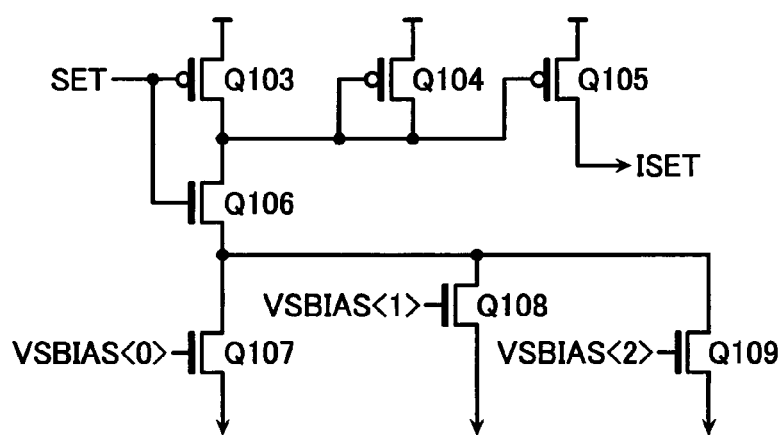
FIG. 24B shows another multivalue set current/voltage bias circuit example according to the same embodiment.

FIG. 24B shows another example of the multivalue SET current/voltage bias circuit 23B. The multivalue SET current/voltage bias circuit 23B varies the bias voltage VSBIAS as VSBIAS<0>, VSBIAS<1>, VSBIAS<2> in accordance with multivalue data to vary the set current ISET flowing in the memory cell. PMOS transistors Q103-Q105 correspond to the PMOS transistors Q93-Q95 in FIG. 24A. Similarly, an NMOS transistor Q106 corresponds to the NMOS transistors Q96-Q98. Similarly, NMOS transistors Q107-Q109 correspond to the NMOS transistors Q99-Q101.

Figure 25:
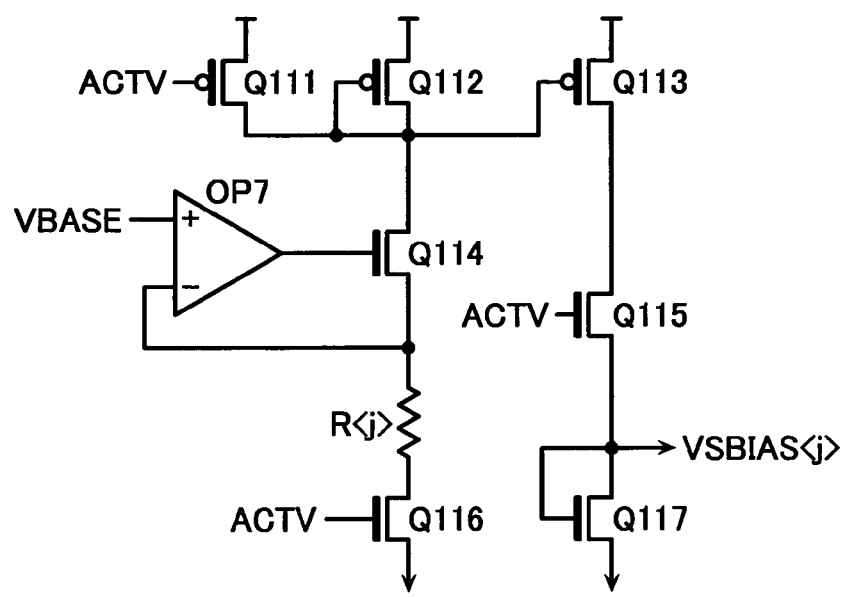
FIG. 25 shows a set reference voltage source circuit used in the circuit of FIG. 24B.

The multivalue bias voltage VSBIAS<j> may be realized in a SET reference voltage source circuit 23a shown in FIG. 25. The SET reference voltage source circuit 23a is similarly configured as the SET reference voltage source circuit 22a shown in FIG. 18 and creates the bias voltage VSBIAS<j> corresponding to the resistance R<j>. An opamp OP7 corresponds to the opamp OP2 shown in FIG. 18. Similarly, PMOS transistors Q111-Q113 correspond to the PMOS transistors Q56, Q50, Q53. Similarly, NMOS transistors Q114-Q117 correspond to the NMOS transistors Q51, Q52, Q54, Q55.

On the other hand, in the R/W circuit 8' of FIG. 23 the S/A circuit 30B is also prepared for multivalue use, different from the preceding embodiment. The S/A circuit 30B includes three opamps OP4, OP5, OP6 that compare different reference levels VRDREF1-3 with respective detected levels to detect quaternary data. It also includes gate circuits G2, G3 and inverters IV4, IV5, IV6 for converting the 3-bit outputs from the opamps OP4-OP6 into 2-bit output data Q0, Q1. The detecting operation is just modified for multivalue and the basic principle is similar to the first embodiment.

Figure 26:
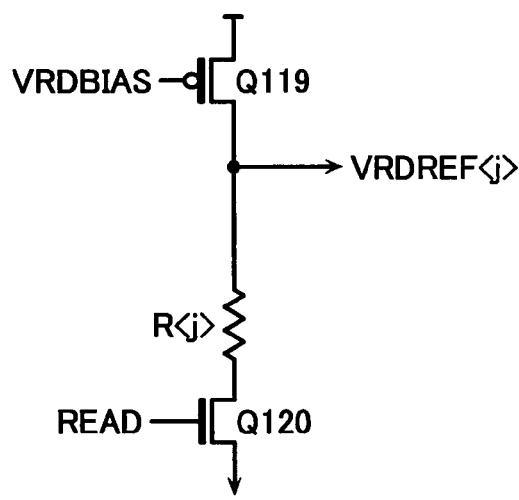
FIG. 26 shows a S/A reference voltage source circuit example used in a multivalue S/A circuit according to the same embodiment.

The reference voltage VRDREF<j> (j=1, 2, 3) to the multivalue S/A circuit 30B shown in FIG. 23 can be realized specifically in a S/A reference voltage source circuit shown in FIG. 26. The S/A reference voltage source circuit 31c generates the reference voltage VRDREF<j>, which can be determined by the value of current flowing in a PMOS transistor Q119 having a gate given the reference voltage VRDBIAS and a resistor R<j> serially connected thereto. An NMOS transistor Q120 can be activated with the read signal READ.

Third Embodiment

FIG. 27 shows a RESET current/voltage bias circuit according to a third embodiment of the present invention. The third embodiment uses a replica copied with the parasitic resistance on the current path to the selected memory cell, different from the first embodiment. The same elements as those in the first embodiment are denoted with the same reference numerals.

Figure 27A:
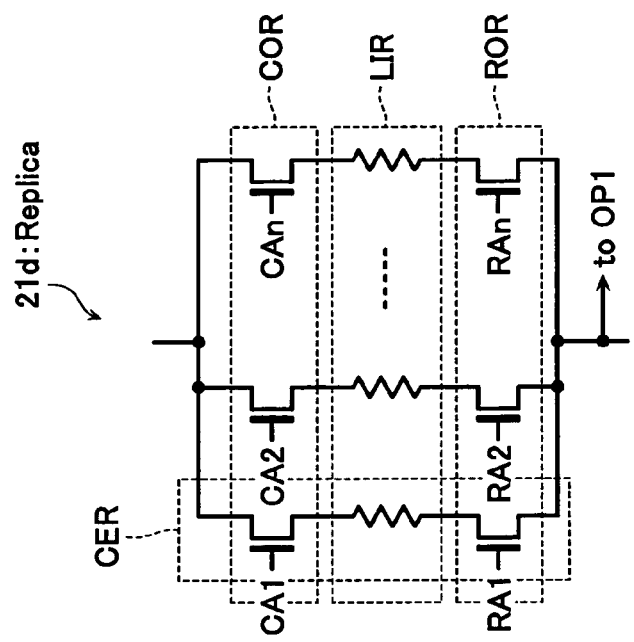
FIG. 27A shows a reset current/voltage bias circuit according to a third embodiment of the present invention.

The RESET current/voltage bias circuit 21B according to the present embodiment is shown in FIG. 27A. The RESET current/voltage bias circuit 21B includes a current mirror circuit 21b, which differs from the first embodiment as follows. Namely, a replica 21d is inserted in a second current path including the transistors Q19, Q20 inside the current mirror circuit 21a in the RESET current/voltage bias circuit 21A in the first embodiment shown in FIG. 13A.

Figure 27B:
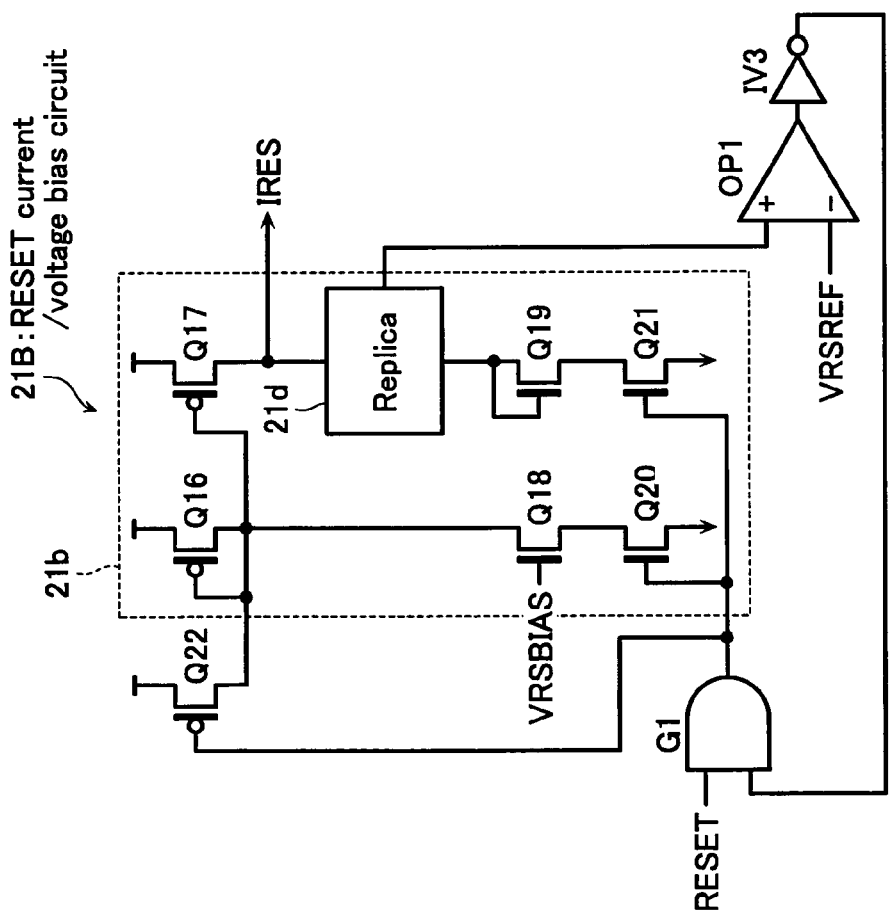
FIG. 27B shows circuitry of a replica used in the circuit of FIG. 27A.

The replica 21d may be configured as shown in FIG. 27B. A replica COR of the column selection switch, a replica LIR of the line resistance from the RESET current/voltage bias circuit 21B to each cell array, and a replica ROR of the row selection switch are contained in a serial circuit. The serial circuit configures a replica CER for each cell array. Plural such replicas CER for each cell array are connected in parallel such that any one of replicas CER for cell arrays can be selected by a column address CA and a row address RA.

The opamp OP1 in the RESET current/voltage bias circuit 21B compares the reference voltage VRSREF with the voltage after subtraction of the voltage drop at the replica 21d.

In accordance with the third embodiment, the replica 21d copied with the parasitic resistance from the R/W circuit 8' to the cell array can be applied to eliminate the signal transmission delay and achieve high-accuracy write.

Fourth Embodiment

A fourth embodiment of the present invention is described next. The fourth embodiment uses a multivalue replica. The multivalue replica includes a replica of resistances of memory cells copied with the current resistance states of memory cells, different from the third embodiment. The same elements as those in the third embodiment are denoted with the same reference numerals.

Figure 28:
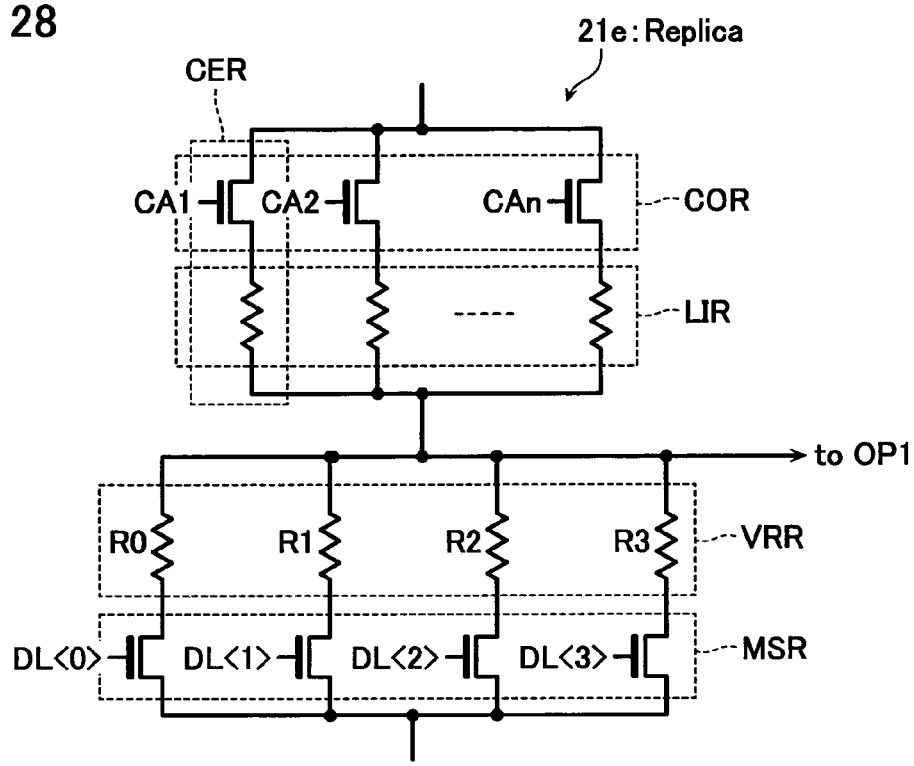
FIG. 28 shows circuitry of a multivalue replica according to a fourth embodiment of the present invention.

FIG. 28 shows a replica 21e for multivalue data. The replica 21e for multivalue data includes a parallel circuit of replicas CER for cell arrays, which is serially connected to a parallel circuit of replicas VRR of resistances of memory cells. The replicas VRR of resistances of memory cells are selected by replicas MSR of memory selection switches, which are serially connected thereto and on/off controlled by data DL<0>-DL<3>. The set voltage VSET is applied to the variable resistor VR in the memory cell MC. Accordingly, the connection point between the replicas CER for cell arrays and the replicas VRR of resistances of memory cells provides the input voltage to the opamp OP1.

In accordance with the fourth embodiment, the replica 21e copied with the parasitic resistance from the R/W circuit 8' to the memory cell that stores multivalue data can be applied to eliminate the signal transmission delay and achieve high-accuracy write. As a result, the reliability of the nonvolatile memory can be improved.

Fifth Embodiment

Figure 29:
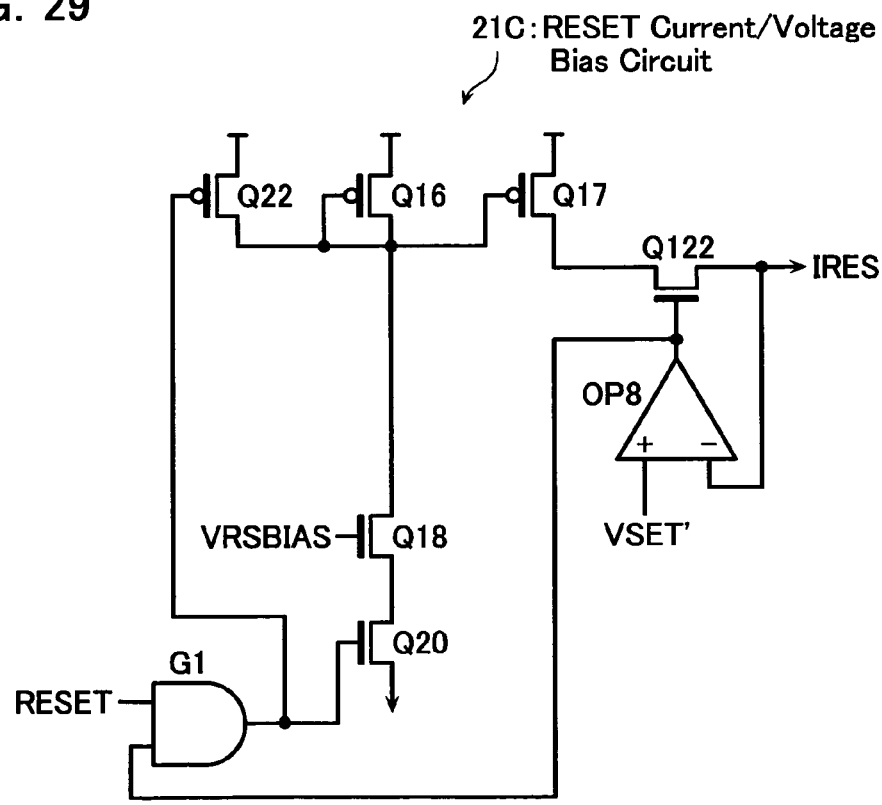
FIG. 29 shows a reset current/voltage bias circuit according to a fifth embodiment of the present invention.

A RESET current/voltage bias circuit according to a fifth embodiment of the present invention is described next. FIG. 29 is a circuit diagram showing the RESET current/voltage bias circuit 21C according to the fifth embodiment.

In the first embodiment, the variation in the value of current supplied to the memory cell from the RESET current/voltage bias circuit 21 is detected to cut off the reset current IRES. In contrast, the RESET current/voltage bias circuit 21C according to the fifth embodiment senses the variation in voltage on the output terminal to cut off the reset current IRES, different from the first embodiment. The same elements as those in the first embodiment are denoted with the same reference numerals.

In this embodiment, a transistor Q122 operative to cut off the reset current IRES is interposed in the current path for the reset current IRES. The transistor Q122 is controlled by the output from an opamp OP8. When the voltage on the output terminal of the RESET current/voltage bias circuit 21C exceeds the reference voltage VSET', the opamp OP8 changes the output to L level to turn off the transistor Q122.

In accordance with the fifth embodiment, the voltage at the time of completion of reset can be monitored to cut off the current flowing in the memory cell. As a result, the reliability of the nonvolatile memory can be improved.

Sixth Embodiment

A RESET current/voltage bias circuit according to a sixth embodiment of the present invention is described next. In the fifth embodiment, the voltage on the output terminal of the circuit is compared to the constant reference voltage VSET' to cut off the reset current IRES. In contrast, the RESET current/voltage bias circuit according to the sixth embodiment uses a load resistance model and compares the voltage appeared on the load resistance model with the voltage applied to the variable resistor VR, different from the fifth embodiment.

Figure 30:
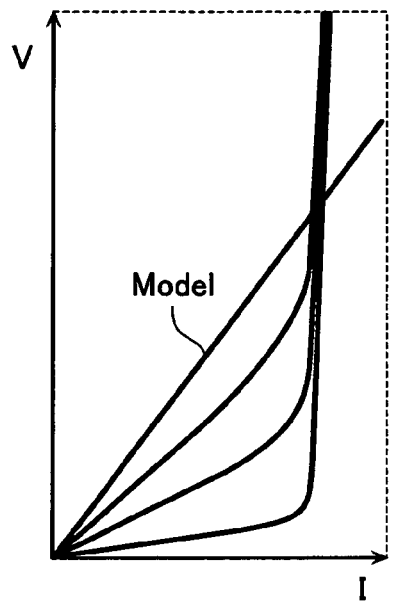
FIG. 30 shows a current-voltage characteristic of the model for use in a reset current/voltage bias circuit according to a sixth embodiment of the present invention.

The load resistance model may include selected one having a current-voltage characteristic as shown in FIG. 30. Regardless of the variation in resistance state of the variable resistor, it is possible to execute control much closer to the actual state if the critical resistance at transition from the set state to the reset state is set as the load resistance model.

Figure 31:
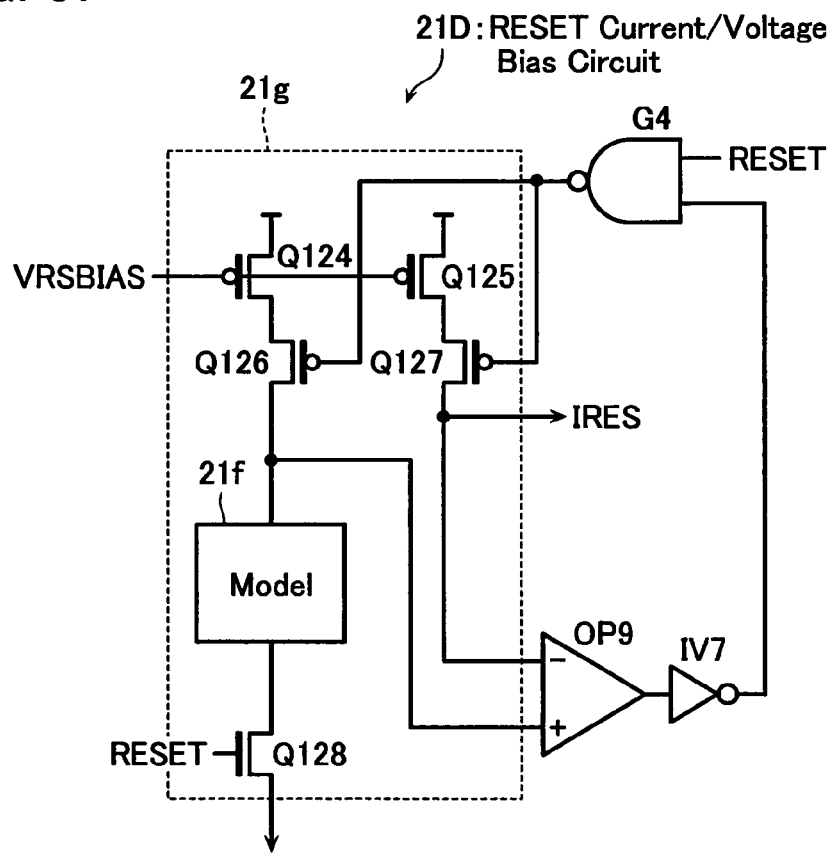
FIG. 31 shows the circuitry of a reset current/voltage bias circuit according to the same embodiment.

FIG. 31 shows a RESET current/voltage bias circuit 21D using the control by the load resistance model. The RESET current/voltage bias circuit 21D includes a current mirror circuit 21g serving as a constant current source operative to supply the reset current IRES, and a monitor circuit operative to compare the voltage on the variable resistor VR with the potential of the load resistance model to halt the supply of the reset current IRES. The monitor circuit includes an opamp OP9, an inverter IV7, and a gate circuit G4. The current mirror circuit 21g includes current supply PMOS transistors Q124, Q125 having respective gates commonly connected, PMOS transistors Q126, Q127 serially connected to the PMOS transistors Q124, Q125, a load resistance model 21f and an NMOS transistor Q128 serially connected to the transistor Q126.

In accordance with the sixth embodiment, the use of the load resistance model allows more accurate control to be executed.

Seventh Embodiment

A RESET current/voltage bias circuit according to a seventh embodiment of the present invention is described next. The RESET current/voltage bias circuit according to the seventh embodiment utilizes a load resistance model corresponding to multivalue data, different from the sixth embodiment. The same elements as those in the sixth embodiment are denoted with the same reference numerals.

Figure 32:
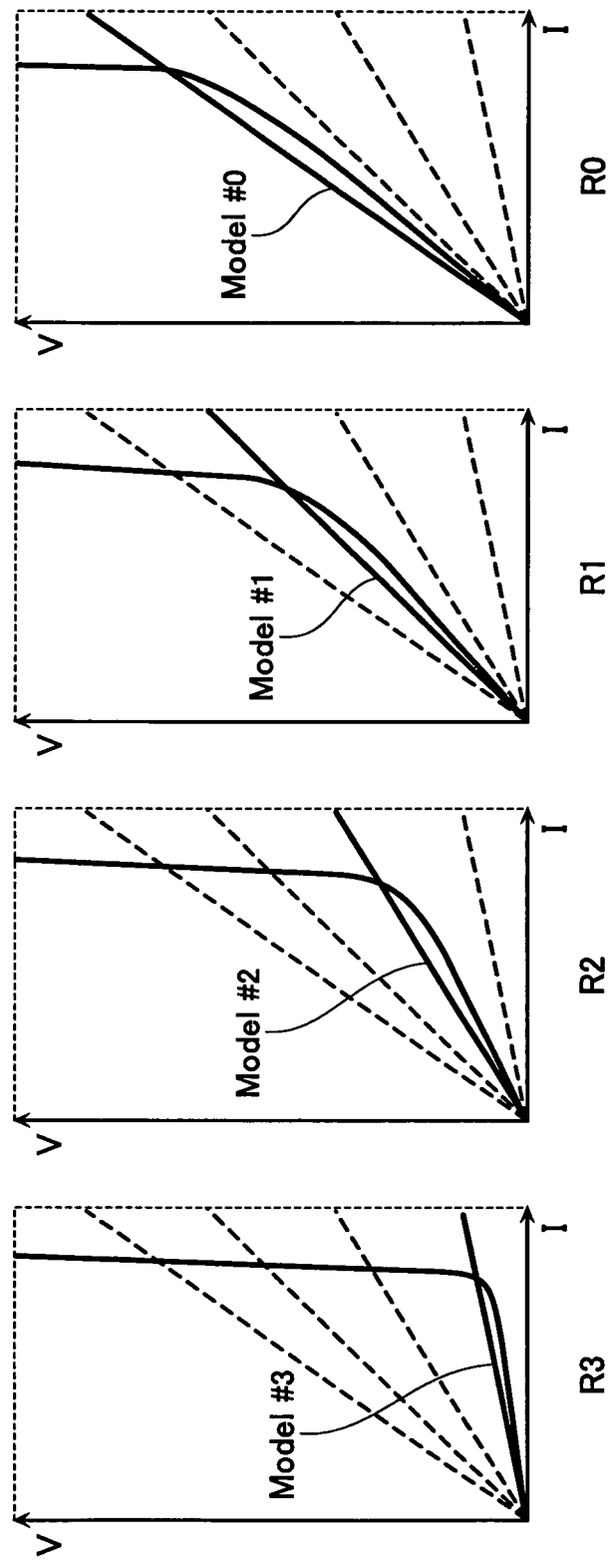
FIG. 32 shows current-voltage characteristics of models for use in a reset current/voltage bias circuit according to a seventh embodiment of the present invention.

Load resistance models (Model #0, Model #1, Model #2, Model #3) having current-voltage characteristics as shown in FIG. 32 may be used as the load resistance models in the present embodiment. The curves in the graphs show actual current-voltage characteristics of memory cells in the state of multivalue data storage with straight lines showing current-voltage characteristics of model resistors. Specifically, resistance model #3 corresponds to the low-resistance state "00", the resistance model #2 to "01", the resistance model #1 to "10", and the resistance model #0 to the high-resistance state "11".

Figure 33:
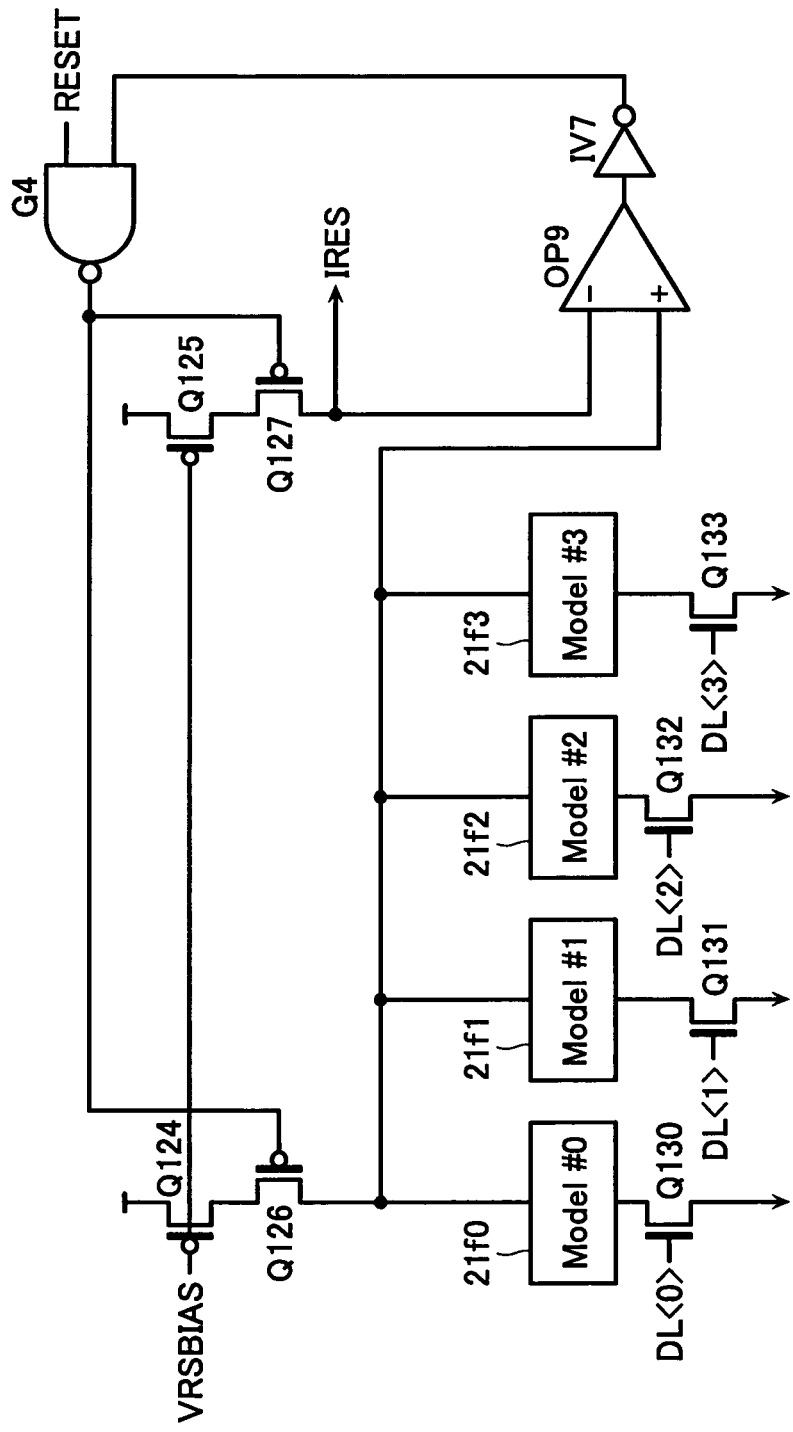
FIG. 33 shows a reset current/voltage bias circuit according to the same embodiment.

A RESET current/voltage bias circuit 21E with these load resistance models is shown in FIG. 33. In the circuit 21E, load resistance models 21f include four load resistance models (Model #1, Model #2, Model #3, Model #4), and transistors Q130, Q131, Q132, Q133 for selecting among the load resistance models, different from the sixth embodiment. Other elements are similar to those in the sixth embodiment and omitted from the following description.

In accordance with a data signal DL<j> (j=0, 1, 2, 3) read out on the data line DL, any one of the transistors Q130, Q131, Q132, Q133 turns on to select any one of the load resistance models. Other operations are similar to those in the sixth embodiment and omitted from the following description.

In accordance with the RESET current/voltage bias circuit according to the seventh embodiment, the load resistance model corresponding to multivalue data is used. Therefore, the potential of the load resistance model can be compared with the potential on the variable resistor to cut off the current flowing in the memory cell. As a result, the reliability of the nonvolatile memory can be improved.

Eighth Embodiment

A S/A circuit according to an eighth embodiment of the present invention is described next. Other than the S/A circuit 30A shown in the first embodiment and the S/A circuit 30B shown in the second embodiment, S/A circuits as shown in FIG. 34A, 34B may be used.

Figure 34B:
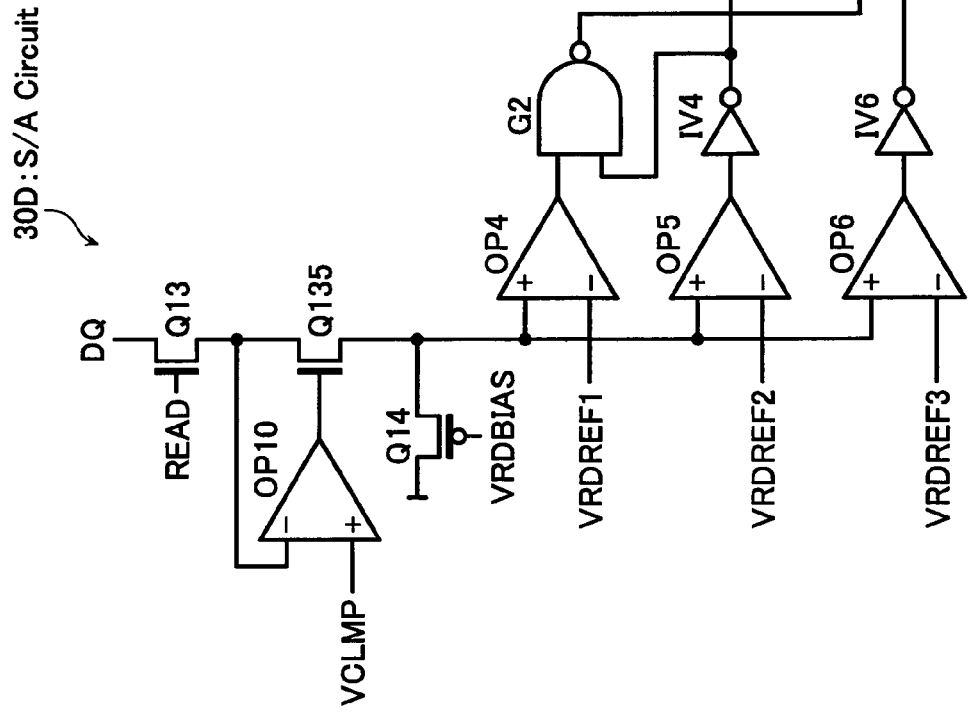
FIG. 34B shows a multivalue S/A circuit in the same embodiment.
Figure 34A:
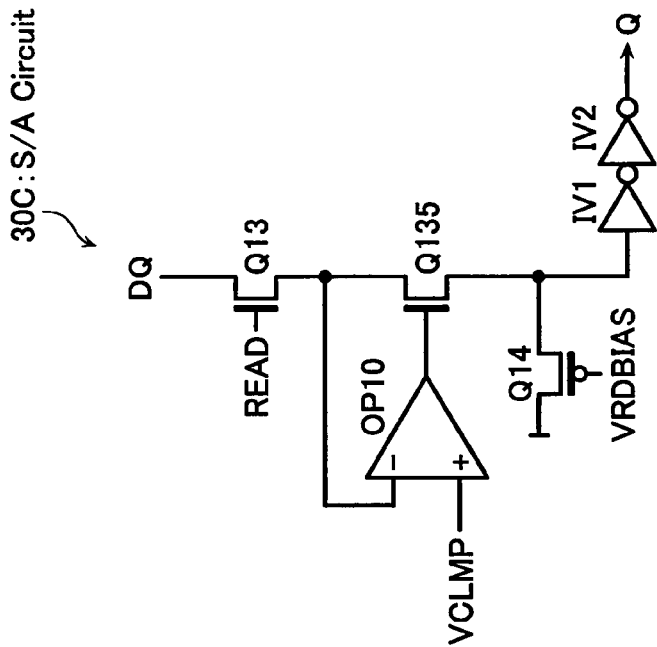
FIG. 34A shows a binary S/A circuit according to an eighth embodiment of the present invention.

The S/A circuit 30C shown in FIG. 34A includes an opamp OP10 and an NMOS transistor Q135 in addition to the S/A circuit 30A shown in FIG. 11 to give a constant voltage bias VCLMP to the memory cell. Thus, more accurate sense operation can be executed.

The S/A circuit 30D shown in FIG. 34B is a multivalue version of the circuit shown in FIG. 34A and configured to apply the constant voltage bias VCLMP to the S/A circuit 30B shown in FIG. 23.

Figure 35:
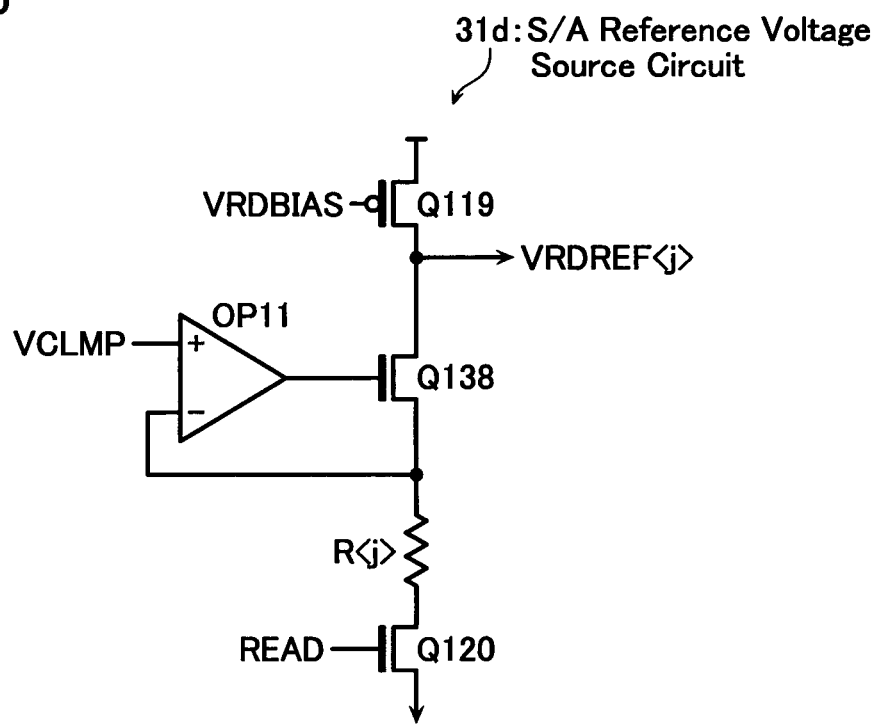
FIG. 35 shows a S/A circuit reference voltage source circuit used in the S/A circuit in FIG. 34B.
Figure 36:
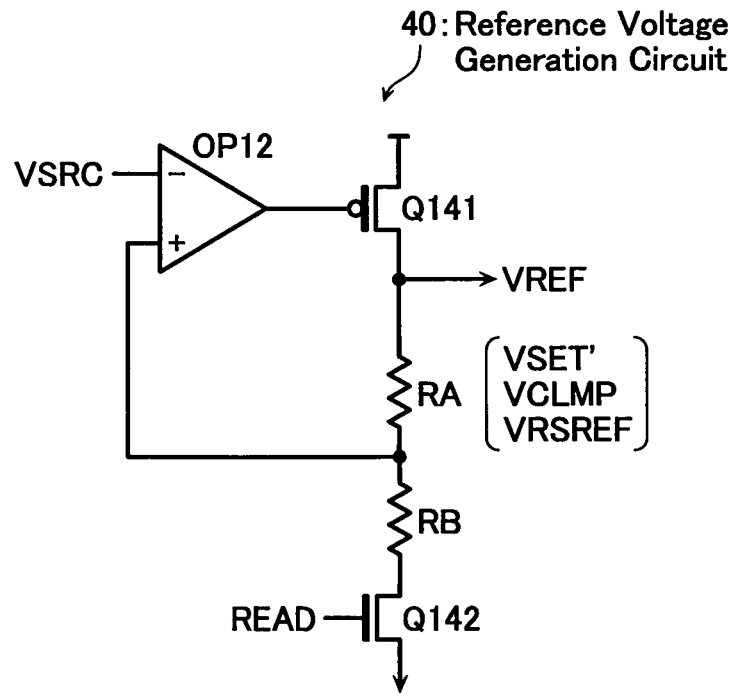
FIG. 36 shows a reference potential generation circuit for use in the above-described embodiments.

The reference voltage VRDREF<j> (j=1, 2, 3) to the multivalue S/A circuit 30D shown in FIG. 34B can be realized specifically in a S/A reference voltage source circuit 31d shown in FIG. 35. The circuit 31d includes a constant voltage bias circuit composed of an opamp OP11 and a transistor Q138, which is added to the S/A reference voltage source circuit 31c shown in FIG. 26, and can further improve the accuracy of current flowing in the resistor R<j>. The above-described various reference voltages VREF (such as VSET', VCLMP, VRSREF) can be generated at a reference potential generation circuit 40 shown in FIG. 36. The circuit 40 includes a PMOS transistor Q141, a resistor RA, a resistor RB and an NMOS transistor Q142 connected in series, and an opamp OP12 operative to control the transistor Q141. The opamp OP12 controls the transistor Q141 to keep the potential on the connection point between the resistor RA and the resistor RB at VSRC. When the signal READ is applied to the gate, the transistor Q142 turns on and provides the reference potential of VSRC×(1+RA/RB).

Ninth Embodiment

Figure 37:
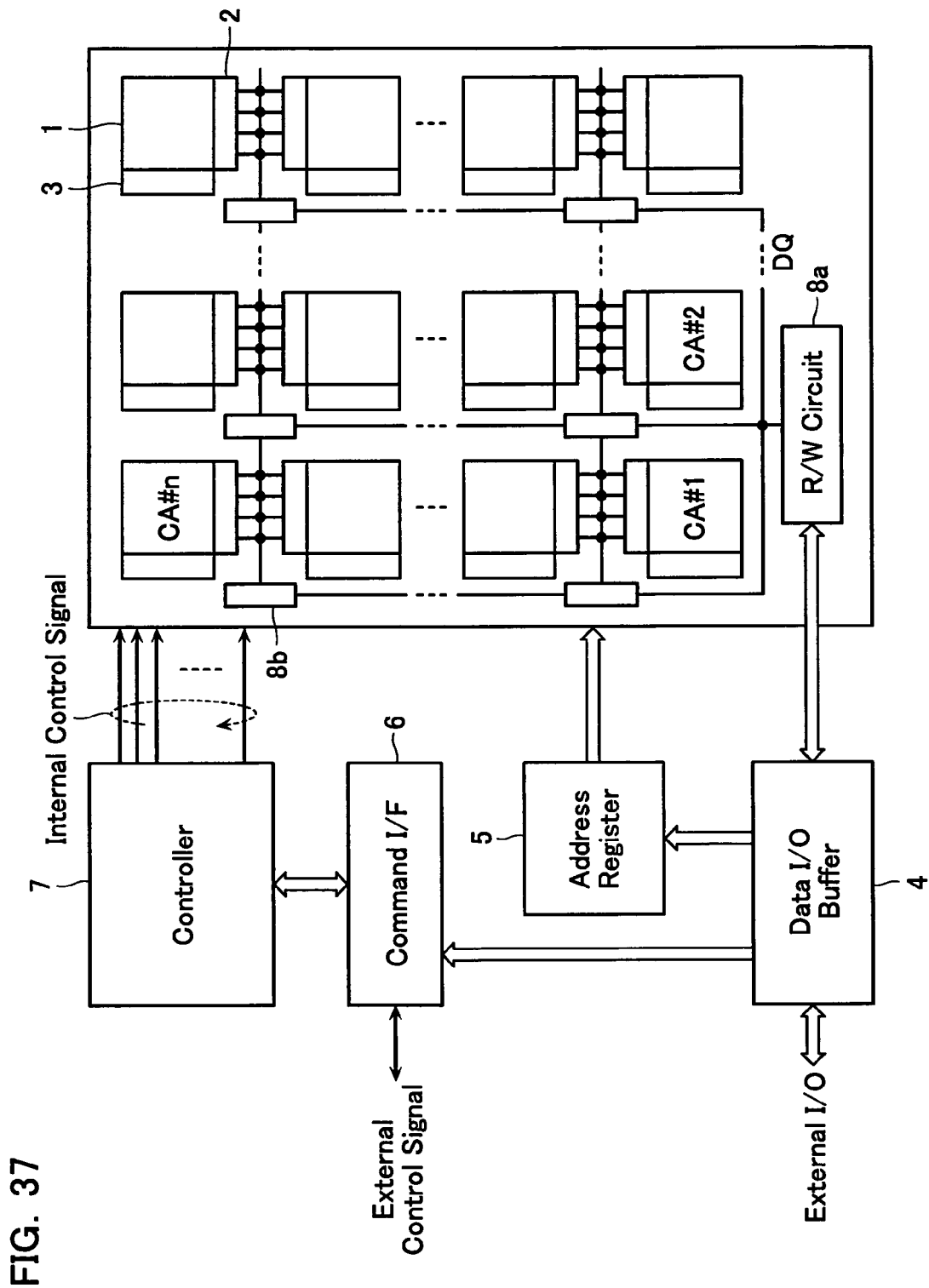
FIG. 37 shows a block diagram of a nonvolatile memory according to a ninth embodiment of the present invention.

A nonvolatile memory according to a ninth embodiment of the present invention is described next. FIG. 37 is a block diagram of the nonvolatile memory according to the ninth embodiment. In the ninth embodiment, the R/W circuit 8 includes a part circuit 8b dispersedly arranged in the vicinity of the memory cell array, and the remaining circuit 8a centrally arranged, different from the first embodiment. The same elements as those in the first embodiment are denoted with the same reference numerals.

The dispersedly arranged circuit 8b may include the RESET current/voltage bias circuit 21, the SET current/voltage bias circuit 23, and the transfer gates Q11, Q12. The centrally arranged circuit 8a may include the S/A circuit 30. Other circuitry is similar to that in the first embodiment and omitted from the following description.

In accordance with nonvolatile memory according to the ninth embodiment, part of the R/W circuit 8 is dispersedly arranged in the vicinity of the memory cell array to eliminate the situation associated with the influence by the parasitic resistance that causes differences between cell arrays. Thus, high-accuracy control can be executed. As a result, it is made possible to provide a nonvolatile memory with improved reliability.

Tenth Embodiment

Figure 38:
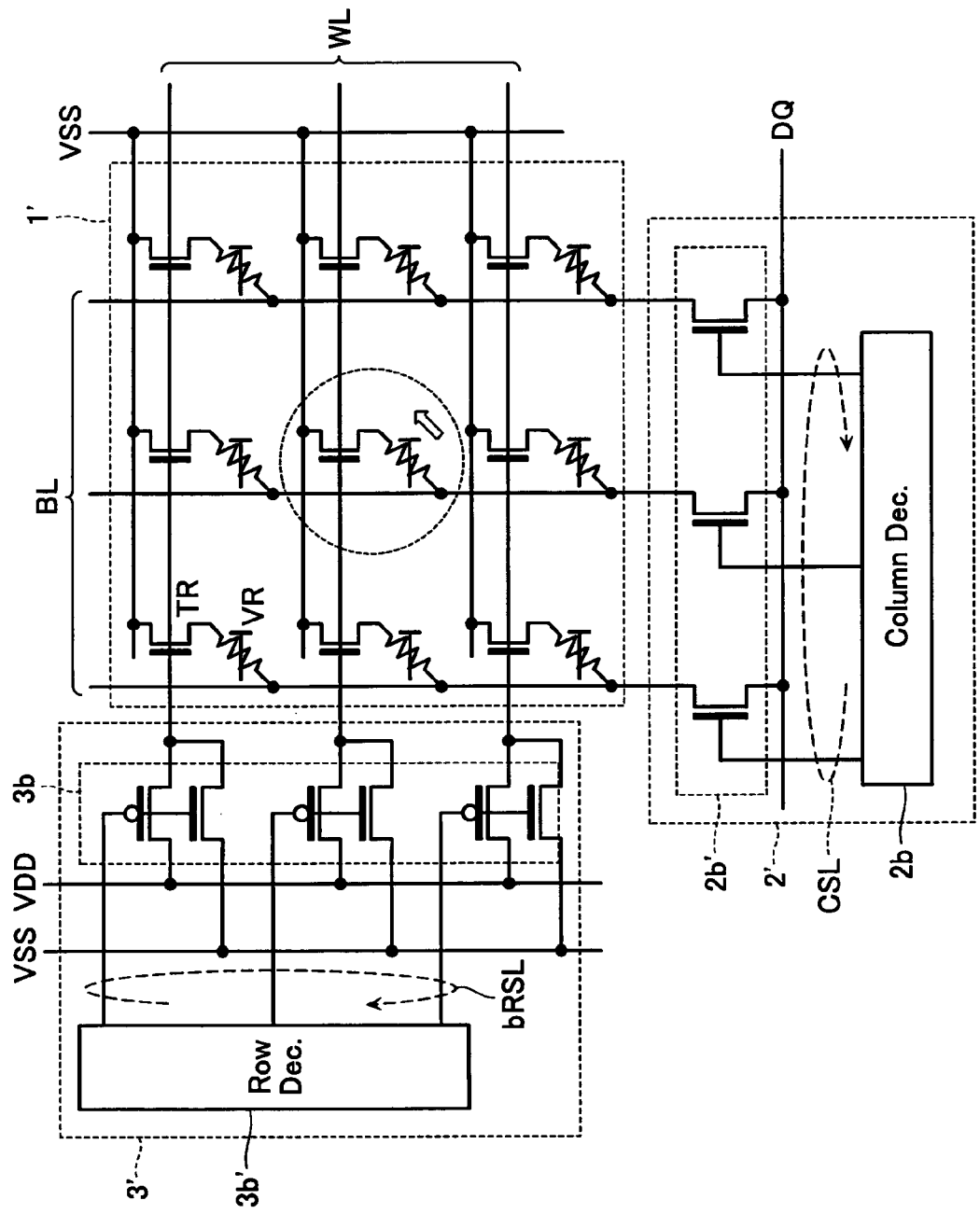
FIG. 38 is a circuit diagram of a memory cell array and peripheral circuits in a nonvolatile memory according to a tenth embodiment of the present invention.
Figure 39:
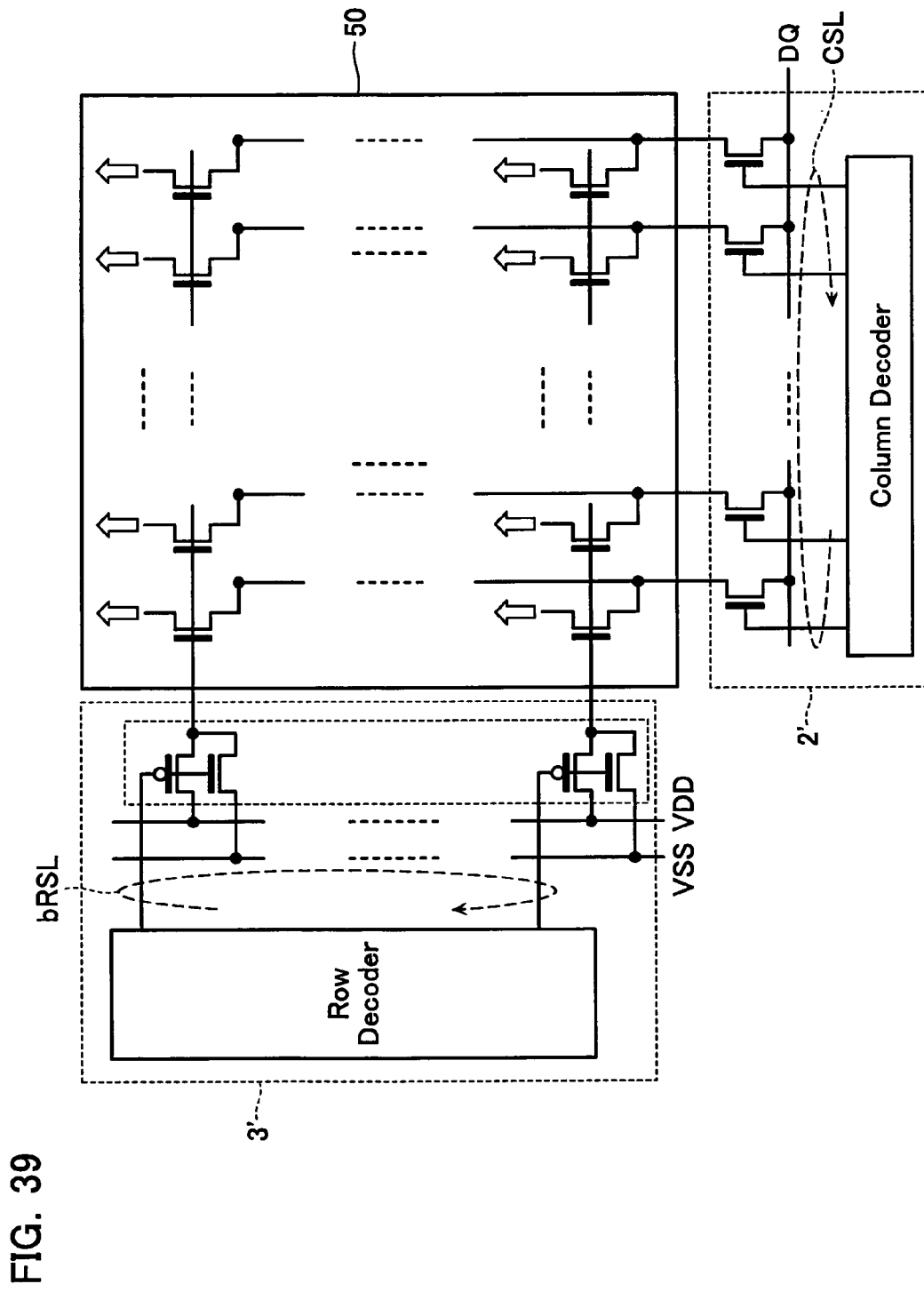
FIG. 39 is a circuit diagram of a probe memory and peripheral circuits according to an eleventh embodiment of the present invention.

A nonvolatile memory according to a tenth embodiment of the present invention is described next. FIG. 38 is a circuit diagram of a memory cell array 1' and peripheral circuits thereof in the nonvolatile memory according to the tenth embodiment. In the nonvolatile memory according to the tenth embodiment, a variable resistor VR and a MOS transistor TR configure a memory cell MC, different from the first embodiment. The same elements as those in the first embodiment are denoted with the same reference numerals.

In FIG. 38, the transistor contained in the memory cell MC has a drain connected to a bit line BL via the variable resistor VR, a source connected commonly to the low-potential source Vss, and a gate connected to a word line WL. Each bit line BL has one end connected to a selection circuit 2b', which is part of a column control circuit 2'. Each word line WL has one end connected to a selection circuit 3b, which is part of a row control circuit 3'.

The selection circuit 2b' includes a selection NMOS transistor provided at each bit line BL. The selection NMOS transistor has a drain connected to a drive sense line DQ, which is used to apply a write pulse and supply a current flow at the time of data read. The selection NMOS transistor has a gate connected to a column selection signal line CSL led from a column decoder 2b operative to select each bit line BL.

The selection circuit 3b includes a selection PMOS transistor and a selection NMOS transistor, of which gates and drains are commonly connected. The selection NMOS transistor has a source connected to the low potential source Vss. The selection PMOS transistor has a source connected to a high potential source VDD. The selection transistors have a common drain connected to the word line WL and a common gate connected to a row selection signal line bRSL led from the row decoder 3b' operative to select each word line WL.

[Selection Operation of Selection Circuit]

The following description is given to selection operation by the selection circuits 2b', 3b.

In the above-described circuits, data is stored in each memory cell MC as the resistance of the variable resistor VR. Taking the circuit shown in FIG. 38 as an example, the row selection signal line bRSL is at "H" level and the column selection signal line CSL is at "L" level, for example, in the non-selected state. In this case, all word lines WL are set at "L" level and all bit lines BL at "L" level. In the non-selected state, the transistors in all memory cells MC are turned off and thus no current flows in the variable resistor VR. Selection of a middle memory cell MC linked to the word line WL and the bit line BL is considered herein. In this case, the row decoder 3b' sets the middle row selection signal line bRSL at "L" level and the column decoder 2b sets the middle column selection signal line CSL at "H" level. As a result, the word line WL is connected to the high potential source VDD and the bit line BL is connected to the drive sense line DQ. Accordingly, application of "H" level to the drive sense line DQ results in the word line WL at "H" level and the bit line BL at "H" level. Thus, in the selected cell, the transistor turns on and allows current to flow in the direction of the arrow. The amount of current flowing in the selected cell can be determined from the resistance of the variable resistor VR. Accordingly, by sensing the value of the current, the data can be read out.

Eleventh Embodiment

A nonvolatile memory according to an eleventh embodiment of the present invention is described next. In the nonvolatile memory according to the eleventh embodiment, a memory cell array comprises a probe memory 50 using a variable resistor in a recording layer, different from the tenth embodiment. Also in this case, the effect of the present invention can be exerted if the memory cell uses the variable resistor. Other elements are similar to those in the tenth embodiment and accordingly omitted from the following description.

Other Embodiments

Although not mentioned specifically in the above embodiments, if a sufficient voltage can not be applied to the memory cell, the above-described supply potentials may be boosted by charge pumps or the like in the memory device and provided to the various circuits.

The present invention may use a phase change memory (such as PCRAM or PRAM) in place of ReRAM as a storage element. In such the case, even after the memory transits to the high-resistance state, the current bias can be controlled to continuously flow to elevate the temperature. Thus, the memory can be prevented from turning again to the low-resistance. The present invention may use a memory (such as PMC or CBRAM) that includes a solid-electrolyte storage element. In such the case, even after the memory turns to the high-resistance, the insulation breakdown due to high-voltage application can be prevented.

The invention claimed is:

1. A nonvolatile semiconductor memory device, comprising:
a cell array having plural memory cells, said each memory cell including a variable resistor having a resistance reversibly variable in response to certain voltage or current supply to store data corresponding to the resistance of said variable resistor;
a selection circuit operative to select a memory cell to be erased or written data from said cell array; and
a write circuit operative to execute certain voltage or current supply to said memory cell selected by said selection circuit to vary the resistance of a variable resistor in said selected memory cell to erase or write data,
wherein said write circuit includes a constant current circuit operative to supply a constant current for data erase to a current path for supplying current to said selected memory cell, and terminates said voltage or current supply to said selected memory cell when current flowing in said selected memory cell reaches a certain level after said data erase or write, wherein said write circuit further includes:
  a first current path for supplying current from said constant current circuit to said selected memory cell;
  a second current path for current monitor provided in parallel with said first current path and supplied with current from said constant current circuit; and
  a resistor circuit copied with a parasitic resistance of said first current path to said second current path; and
wherein said resistor circuit inserts a resistor into said second current path, said resistor corresponding to the first current path selected by said selection circuit.

2. The nonvolatile semiconductor memory device according to claim 1, said write circuit further includes
  a monitor circuit operative to terminate supply of said constant current when the value of current flowing in said second current path reaches a certain level.

3. The nonvolatile semiconductor memory device according to claim 2, said write circuit further includes a reset circuit at an output terminal thereof.

4. The nonvolatile semiconductor memory device according to claim 2, said write circuit further includes a reference voltage source circuit operative to generate a bias voltage for determining the value of current flowing in said constant current circuit,
  wherein said reference voltage source circuit generates a temperature variation-compensated bias voltage.

5. The nonvolatile semiconductor memory device according to claim 1, wherein said cell array is one of a plurality of cell arrays provided and said write circuit is dispersedly arranged in the vicinity of said plural cell arrays.

6. The nonvolatile semiconductor memory device according to claim 1, wherein said cell array is configured as a probe memory using said variable resistor in a storage layer.

7. A nonvolatile semiconductor memory device, comprising:
  a cell array having plural memory cells, said each memory cell including a variable resistor having a resistance reversibly variable in response to certain voltage or current supply to store data corresponding to the resistance of said variable resistor;
  a selection circuit operative to select a memory cell to be erased or written data from said cell array; and
  a write circuit operative to execute plural types of certain voltage or current supply to said memory cell selected by said selection circuit based on ternary or higher write data to vary the resistance of a variable resistor in said selected memory cell in three or more stages to erase or write data,
wherein said write circuit includes a constant current circuit operative to supply a constant current for data erase to a current path for supplying current to said selected memory cell, and terminates said voltage or current supply to said memory cell when said voltage or current supplied to said memory cell reaches a certain level after said data erase or write,
wherein said write circuit further includes:
  a first current path for supplying current from said constant current circuit to said selected memory cell;
  a second current path for current monitor provided in parallel with said first current path and supplied with current from said constant current circuit; and
  a resistor circuit copied with a parasitic resistance of said first current path and a current resistance state of said variable resistor in said selected memory cell to said second current path, the resistor circuit being supplied with current from said constant current circuit; and
wherein said resistor circuit inserts a resistor into said second current path, said resistor corresponding to the first current path selected by said selection circuit.

8. The nonvolatile semiconductor memory device according to claim 7, said write circuit further includes
  a monitor circuit operative to terminate supply of said constant current when the value of current flowing in said second current path reaches a certain level.

9. The nonvolatile semiconductor memory device according to claim 8, said write circuit further includes a reset circuit at an output terminal thereof.

10. The nonvolatile semiconductor memory device according to claim 7, said write circuit includes
  a monitor circuit operative to terminate supply of said constant current when the value of voltage at the current supply terminal on said constant current circuit reaches a certain level.

11. The nonvolatile semiconductor memory device according to claim 10, said write circuit further includes a reference voltage source circuit operative to generate a bias voltage for determining the value of current flowing in said constant current circuit,
  wherein said reference voltage source circuit generates a temperature variation-compensated bias voltage.

12. The nonvolatile semiconductor memory device according to claim 7, said write circuit includes
  a resistor circuit copied with the current resistance state of said variable resistor in said selected memory cell, the resistor circuit being supplied with current from said constant current circuit, and
  a monitor circuit operative to terminate supply of said current from said constant current circuit when the voltage at the current supply terminal on said constant current circuit becomes lower than the voltage appeared on said resistor circuit.

* * * * *